United States Patent
Kim et al.

(10) Patent No.: US 9,412,693 B2
(45) Date of Patent: Aug. 9, 2016

(54) SEMICONDUCTOR DEVICE HAVING JUMPER PATTERN AND BLOCKING PATTERN

(71) Applicant: Samsung Electronics Co., Ltd., Suwon-si (KR)

(72) Inventors: Yoon-Hae Kim, Suwon-si (KR); Jong-Shik Yoon, Yongin-si (KR); Hwa-Sung Rhee, Seongnam-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 150 days.

(21) Appl. No.: 14/174,705

(22) Filed: Feb. 6, 2014

(65) Prior Publication Data
US 2014/0332871 A1    Nov. 13, 2014

(30) Foreign Application Priority Data
May 10, 2013 (KR) .................. 10-2013-0053290

(51) Int. Cl.
| | |
|---|---|
| H01L 27/11 | (2006.01) |
| H01L 23/525 | (2006.01) |
| H01L 49/02 | (2006.01) |
| H01L 23/485 | (2006.01) |
| H01L 23/522 | (2006.01) |
| H01L 27/06 | (2006.01) |
| H01L 21/8234 | (2006.01) |
| H01L 21/768 | (2006.01) |
| H01L 23/532 | (2006.01) |

(52) U.S. Cl.
CPC ...... *H01L 23/5256* (2013.01); *H01L 21/76808* (2013.01); *H01L 21/76895* (2013.01); *H01L 21/823475* (2013.01); *H01L 23/485* (2013.01); *H01L 23/5221* (2013.01); *H01L 23/5223* (2013.01); *H01L 23/5228* (2013.01); *H01L 23/53295* (2013.01); *H01L 27/0629* (2013.01); *H01L 28/20* (2013.01); *H01L 28/60* (2013.01); *H01L 23/53223* (2013.01); *H01L 23/53238* (2013.01); *H01L 23/53266* (2013.01); *H01L 2924/0002* (2013.01)

(58) Field of Classification Search
USPC ................. 257/295, 300, 379, 529, 530, 774; 438/132
See application file for complete search history.

(56) References Cited

U.S. PATENT DOCUMENTS

| | | | |
|---|---|---|---|
| 5,872,029 A | 2/1999 | Gardner et al. | |
| 6,086,777 A * | 7/2000 | Cheng | C23F 4/00 216/67 |

(Continued)

FOREIGN PATENT DOCUMENTS

| | | |
|---|---|---|
| JP | 2002-222918 A | 8/2002 |
| KR | 10-0671563 B1 | 6/2006 |

(Continued)

*Primary Examiner* — Errol Fernandes
(74) *Attorney, Agent, or Firm* — Muir Patent Law, PLLC

(57) ABSTRACT

A semiconductor device includes a substrate having a transistor area, a gate structure disposed on the transistor area of the substrate, a first interlayer insulating layer covering the gate structure, a blocking pattern disposed on the first interlayer insulating layer, and a jumper pattern disposed on the blocking pattern. The jumper pattern includes jumper contact plugs vertically penetrating the first interlayer insulating layer to be in contact with the substrate exposed at both sides of the gate structure, and a jumper section configured to electrically connect the jumper contact plugs.

20 Claims, 26 Drawing Sheets

(56) References Cited

U.S. PATENT DOCUMENTS

| | | | |
|---|---|---|---|
| 7,557,401 B2 | 7/2009 | Yonehama et al. | |
| 8,003,461 B1 | 8/2011 | Hsu et al. | |
| 8,053,809 B2 | 11/2011 | Cheng et al. | |
| 8,159,040 B2 | 4/2012 | Coolbaugh et al. | |
| 8,324,046 B2 | 12/2012 | Thei et al. | |
| 2007/0096250 A1* | 5/2007 | Watanabe | H01L 23/5256 257/529 |
| 2008/0179646 A1* | 7/2008 | Ozaki | H01L 27/11507 257/295 |
| 2009/0142917 A1 | 6/2009 | Kim | |
| 2009/0321946 A1* | 12/2009 | Gosset | H01L 21/7682 257/774 |
| 2010/0078727 A1 | 4/2010 | Min et al. | |
| 2010/0301417 A1 | 12/2010 | Cheng et al. | |
| 2011/0089494 A1 | 4/2011 | Egawa et al. | |
| 2011/0189827 A1 | 8/2011 | Su et al. | |
| 2011/0195569 A1 | 8/2011 | Moon et al. | |
| 2012/0043614 A1 | 2/2012 | Choi et al. | |
| 2012/0196423 A1 | 8/2012 | Kanike et al. | |
| 2013/0277754 A1* | 10/2013 | Liang | H01L 27/0629 257/379 |

FOREIGN PATENT DOCUMENTS

| | | |
|---|---|---|
| KR | 10-2007-0088061 A | 8/2007 |
| KR | 10-1185947 B1 | 6/2013 |

* cited by examiner

FIG. 2A
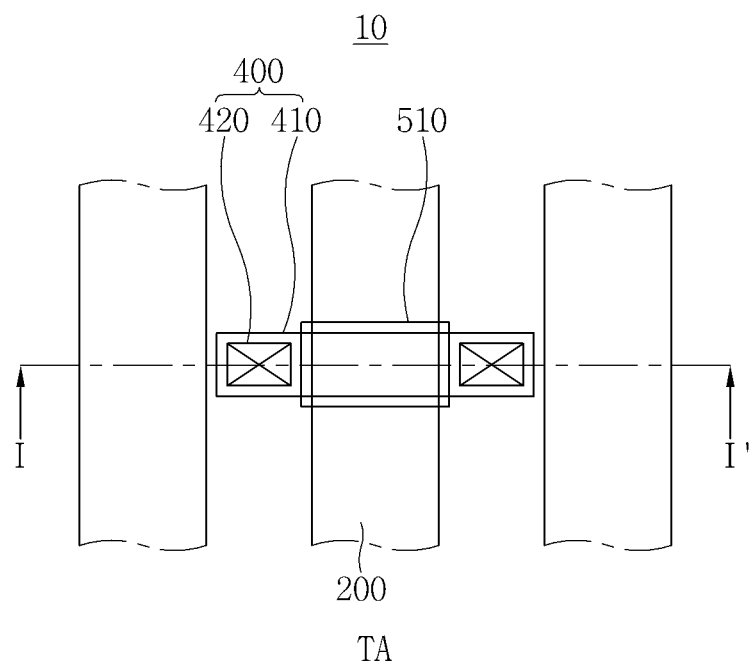
TA
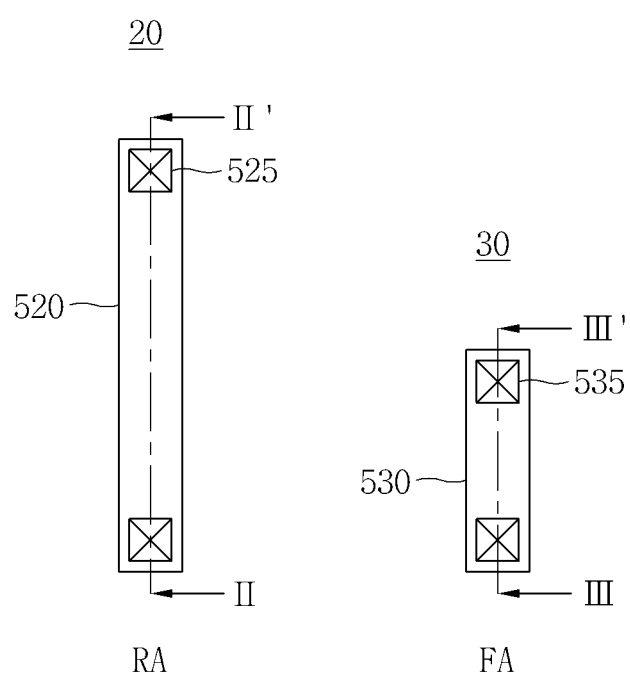
RA  FA

FIG. 2B
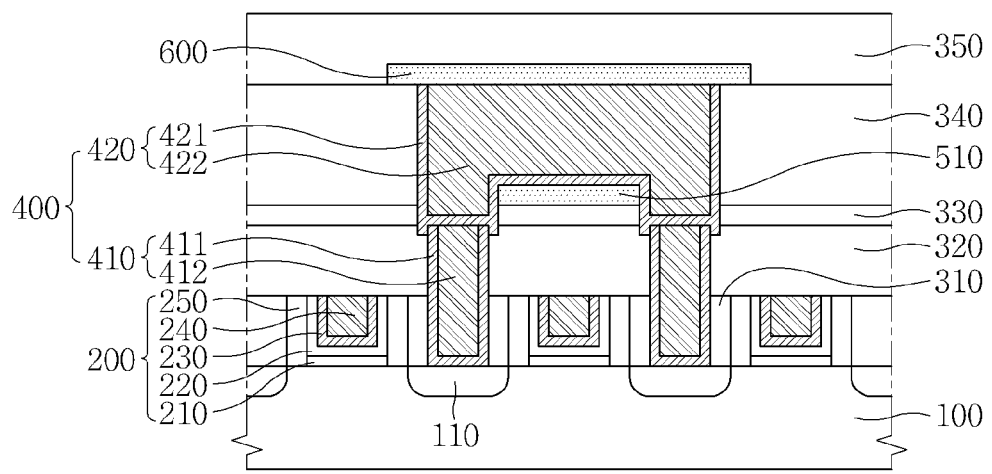
TA
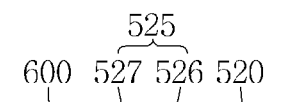
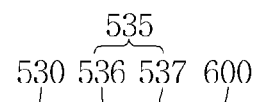
RA    FA

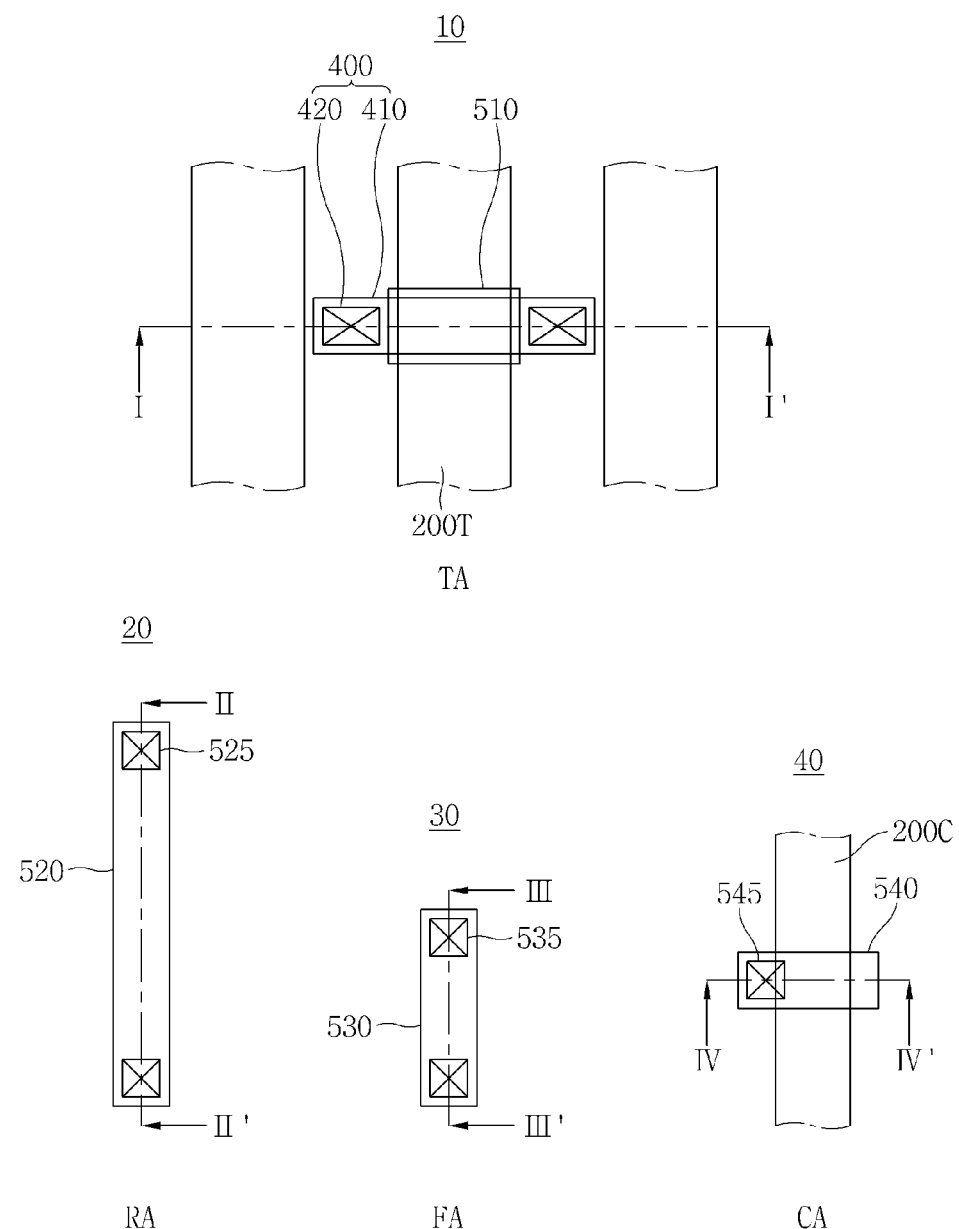

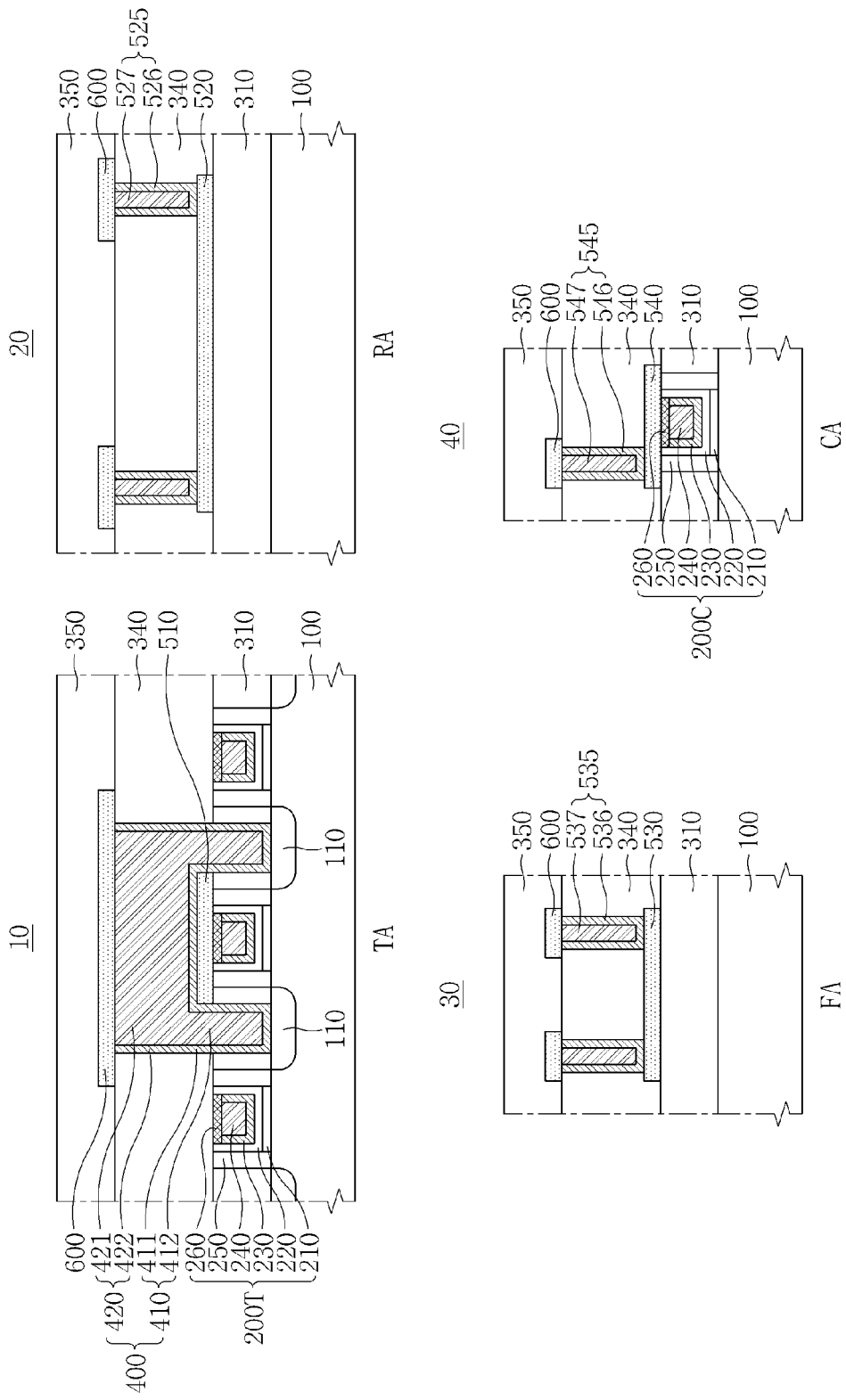

FIG. 6A
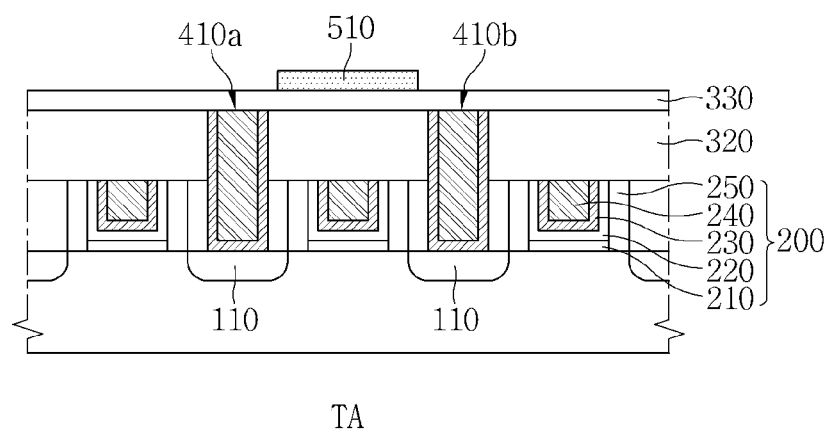
TA
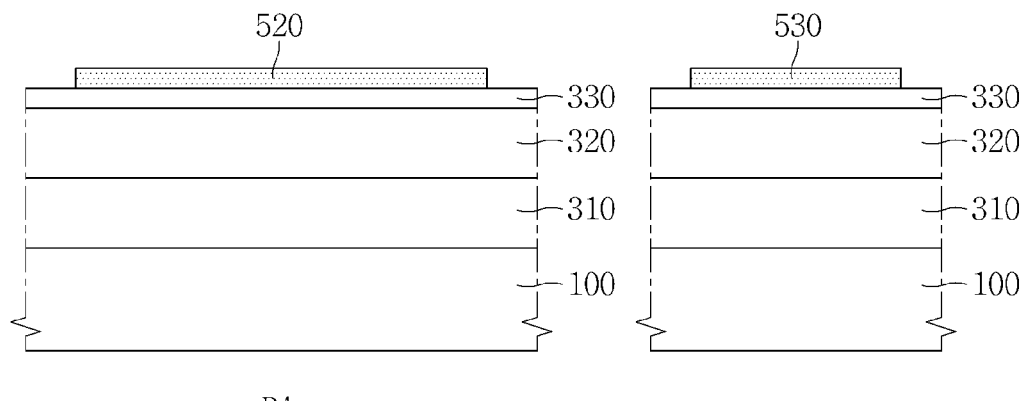
RA            FA

FIG. 6B
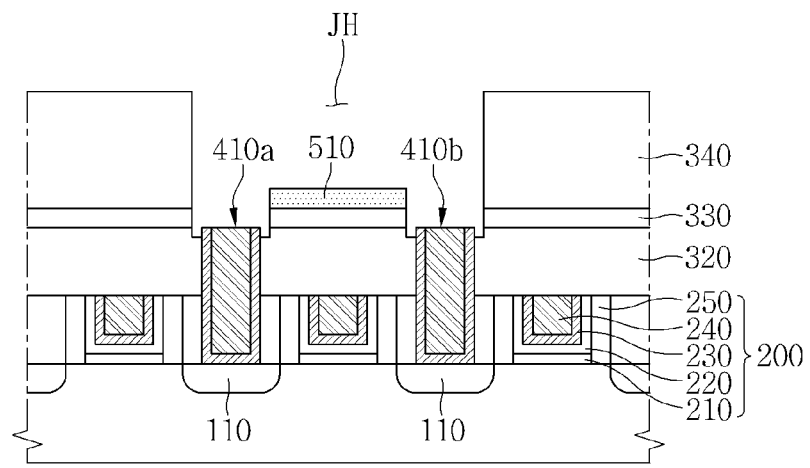
TA
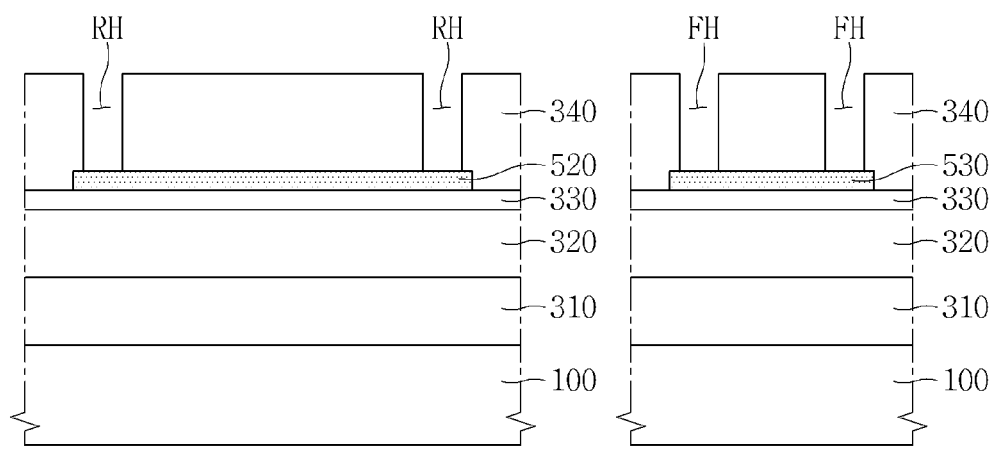
RA          FA

FIG. 6C
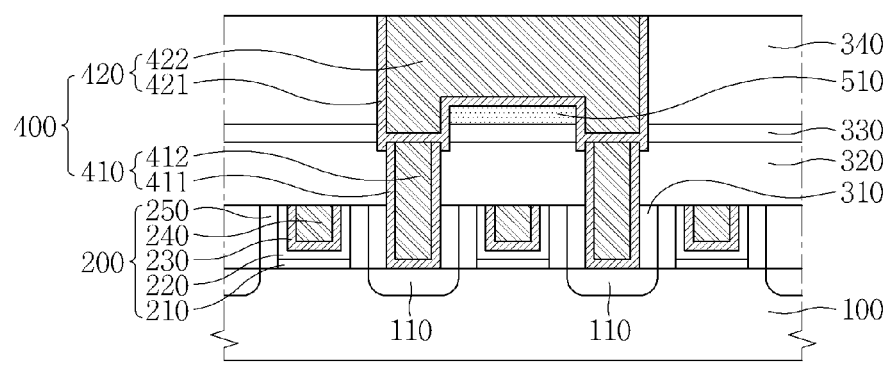
TA
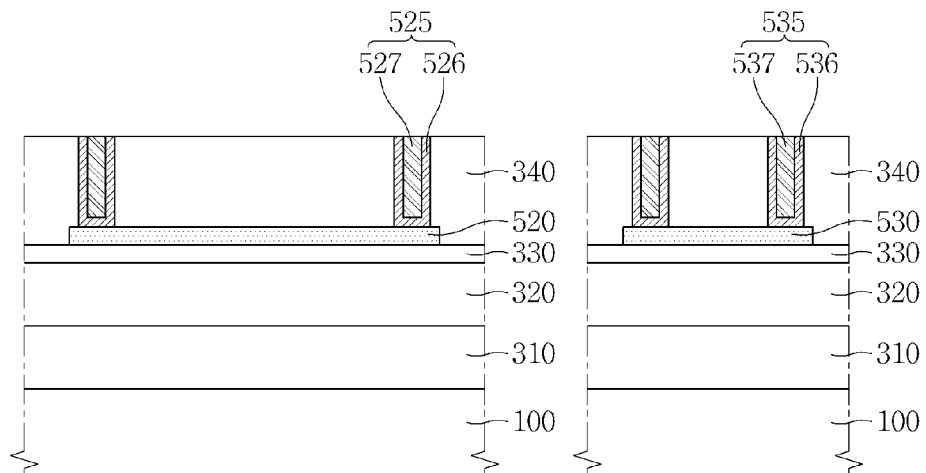
RA                FA

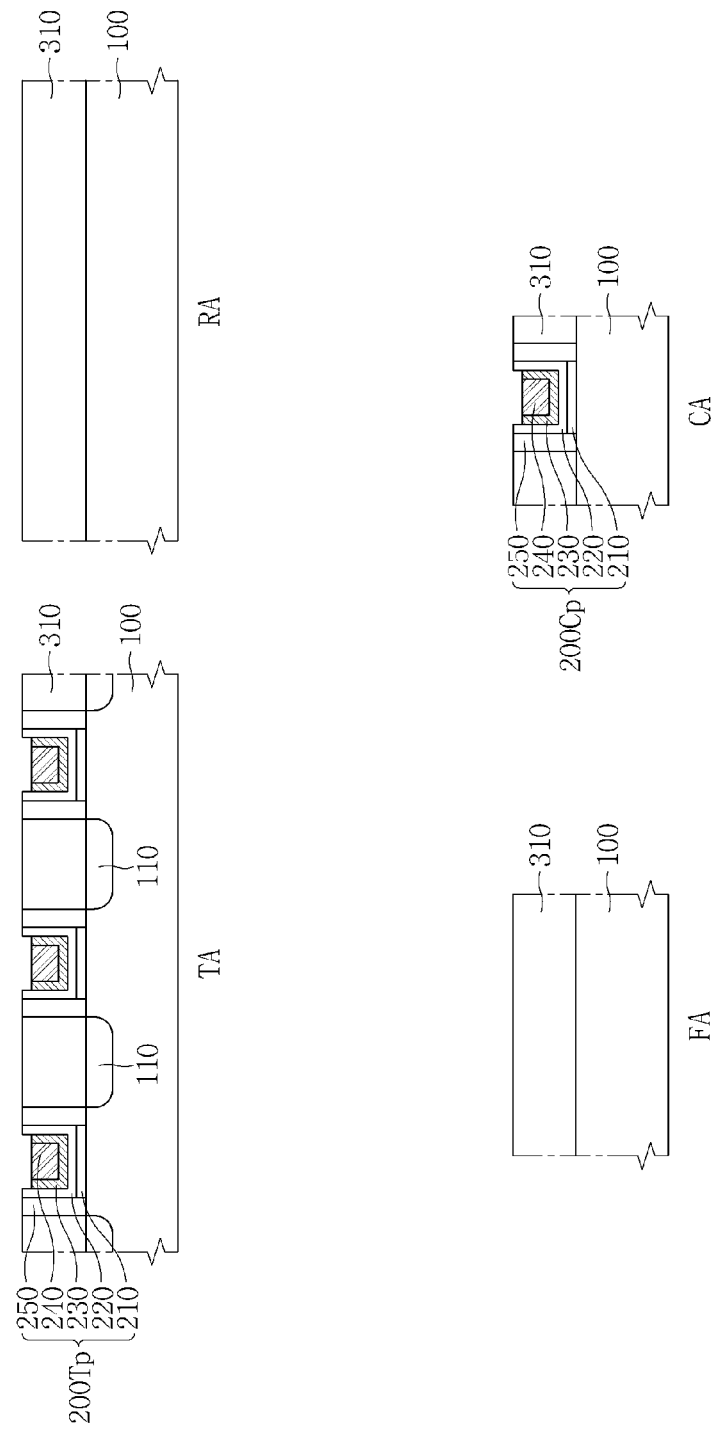

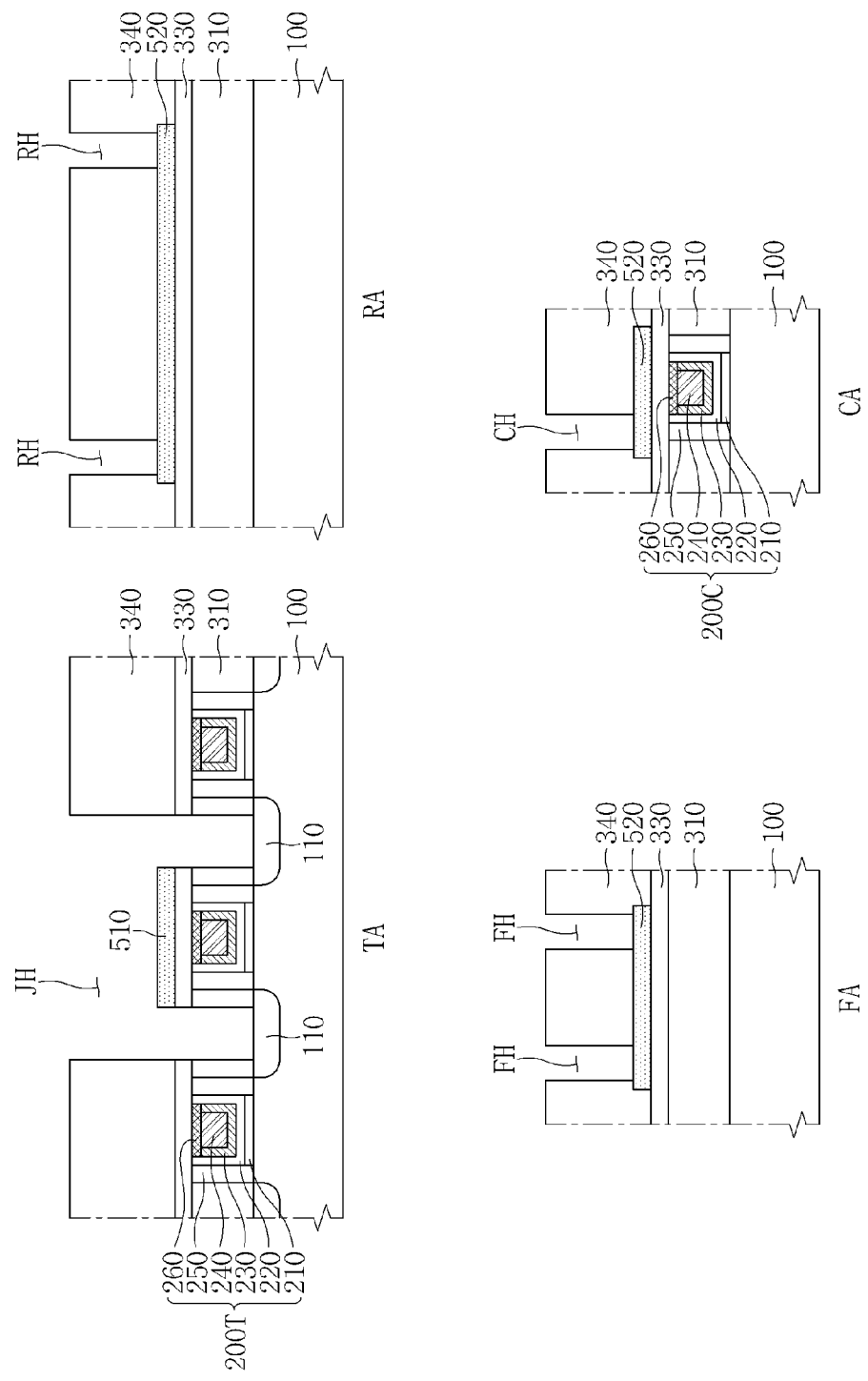

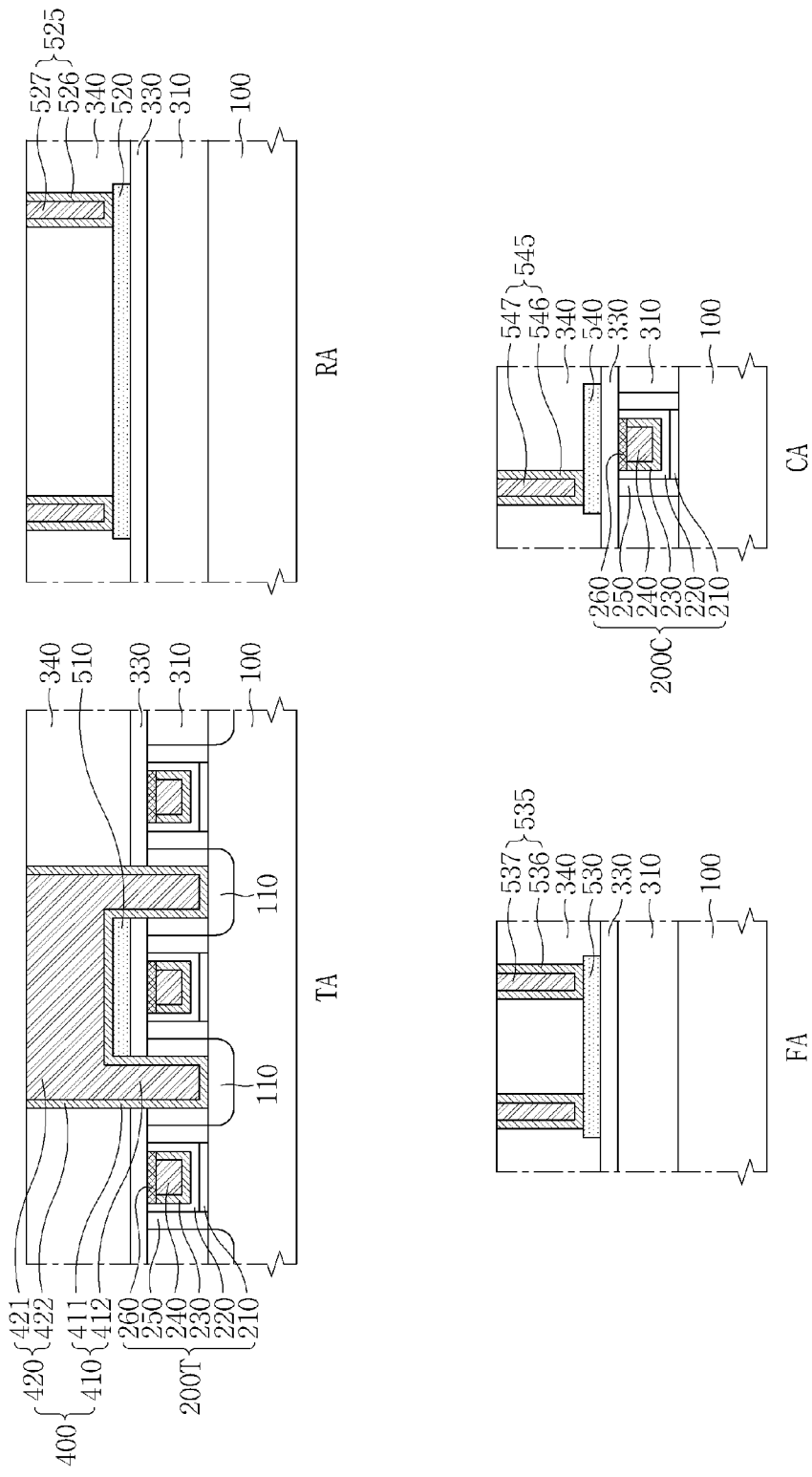

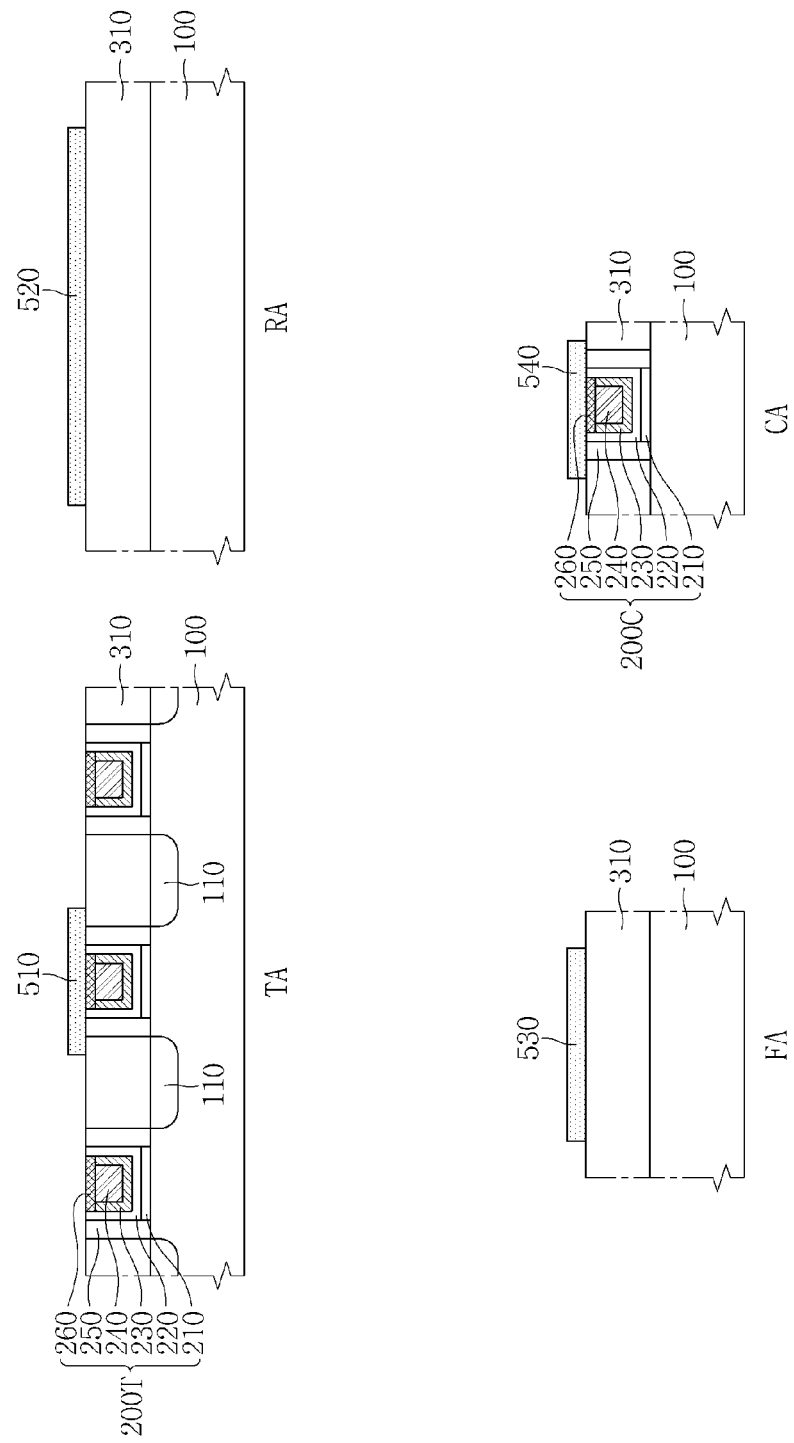

SEMICONDUCTOR DEVICE HAVING JUMPER PATTERN AND BLOCKING PATTERN

CROSS-REFERENCE TO RELATED APPLICATION

This application claims priority under 35 U.S.C. §119 to Korean Patent Application No. 10-2013-0053290 filed on May 10, 2013, the disclosure of which is hereby incorporated by reference in its entirety.

BACKGROUND

Embodiments of the inventive concepts relate to a semiconductor device having a jumper pattern and a blocking pattern.

With increases in the degree of integration and miniaturization of patterns in semiconductor devices, there are technical challenges in forming jumper patterns.

SUMMARY

Embodiments of the inventions provide a semiconductor device having a jumper pattern and a blocking pattern.

Other embodiments of the inventions provide a semiconductor device having a jumper pattern, a blocking pattern, a resistor pattern, a fuse pattern and/or an electrode pattern.

Still other embodiments of the inventions provide a method of fabricating a semiconductor device having a jumper pattern and a blocking pattern.

Yet still other embodiments of the inventions provide a method of fabricating a semiconductor device having a jumper pattern, a blocking pattern, a resistor pattern, a fuse pattern and/or an electrode pattern.

Aspects of the inventions should not be limited by the above description, and many aspects beyond those explicitly described will be clearly understood by one of ordinary skill in the art from example embodiments described herein.

In accordance with an aspect of the inventions, a semiconductor device is provided. The semiconductor device includes: a substrate having a transistor area; a gate structure disposed on the transistor area of the substrate; a first interlayer insulating layer covering the gate structure; a blocking pattern disposed on the first interlayer insulating layer; and a jumper pattern disposed on the blocking pattern. The jumper pattern may include jumper contact plugs vertically penetrating the first interlayer insulating layer to be in contact with the substrate exposed at both sides of the gate structure, and a jumper section configured to electrically connect the jumper contact plugs.

In accordance with other aspects of the inventions, a semiconductor device may include: a substrate having a transistor area, a resistor area, and a fuse area; a gate structure disposed on the transistor area of the substrate; an interlayer insulating layer disposed on the gate structure; a blocking pattern disposed on the interlayer insulating layer of the transistor area, and vertically overlapping the gate structure; a resistor pattern disposed on the interlayer insulating layer of the resistor area; a fuse pattern disposed on the interlayer insulating layer of the fuse area, and having the same material as the blocking pattern and the resistor pattern; and a jumper pattern disposed on the blocking pattern. The jumper pattern may include two jumper contact plugs in contact with the substrate exposed at both sides of the gate structure, and a jumper section in contact with the blocking pattern and configured to connect the two jumper contact plugs.

According to other aspects of the inventions, a semiconductor device includes a substrate, a transistor gate structure disposed above the substrate, a first insulating layer disposed above the substrate, a blocking pattern disposed above the first insulating layer and the gate structure, and a jumper pattern disposed above the blocking pattern. The jumper pattern includes jumper contact plugs and a jumper section. The jumper contact plugs vertically penetrate the first insulating layer to be in contact with the substrate at first and second sides of the gate structure. The jumper section is configured to electrically connect the jumper contact plugs.

According to various aspects, the blocking pattern vertically overlaps the transistor gate structure and comprises a conductive material such as metal. The blocking pattern may be in contact with the jumper section. The jumper contact plugs and the jumper section may be in contact with the blocking pattern.

According to other aspects, a semiconductor device may include a stopper layer including silicon nitride formed above the first insulating layer. A second insulating layer above the first insulating layer surrounds at least some of the jumper section, and an upper insulating layer may be formed above the second insulating layer and the jumper section. The blocking pattern may be in contact with the stopper layer.

According to various other aspects, a semiconductor device may further include a resistor pattern or a fuse pattern formed above the first interlayer insulating layer. A resistor contact plug can contact the resistor pattern, with the upper surface of the resistor contact plug and the upper surface of the jumper section approximately equidistant from the substrate. The lower surface of the fuse and the lower surface of the blocking pattern are approximately equidistant from the substrate, and a fuse contact plug in contact with the fuse can have its upper surface approximately the same distance from the substrate as the upper surface of the jumper section.

According to still other aspects, a semiconductor device further includes a capacitor lower electrode formed above the substrate with substantially the same structure as a transistor gate structure. A capping layer may be disposed on the capacitor lower electrode, a capacitor upper electrode may be formed above the first insulating layer, and the blocking pattern and the capacitor upper electrode may comprise the same material.

The jumper contact plugs may include a contact barrier layer that surrounds a bottom and sides of a contact core layer and may be in contact with the substrate. The jumper section may include a jumper barrier layer that surrounds a bottom and sides of a jumper core layer and is in contact with an upper surface of the blocking pattern. The contact barrier layer and the jumper barrier layer may be formed from the same material.

According to yet still other aspects of the inventions, a semiconductor device includes a substrate, a gate structure disposed above a first area of the substrate, an interlayer insulating layer disposed above the gate structure, a blocking pattern disposed on the interlayer insulating layer and vertically overlapping the gate structure, a resistor pattern disposed above the interlayer insulating layer, a fuse disposed above the interlayer insulating layer and including the same material as the blocking pattern and the resistor pattern, and a jumper pattern disposed above the blocking pattern. The jumper pattern includes two jumper contact plugs and a jumper section connecting the two jumper contact plugs. The jumper section may be in contact with the blocking pattern, and the jumper contact plugs may be in contact with the substrate.

According to various other aspects, a semiconductor device includes a substrate, a first layer (insulating, e.g., silicon oxide or silicon nitride) that has a planarized top surface disposed above the substrate, and a second layer (conducting, e.g., including metal) in contact with the top surface of the first layer. The second layer includes discrete regions having substantially coplanar top surfaces. The jumper pattern may be disposed on the top surface of a first region of the second layer, and a resistor pattern, capacitor, and/or fuse pattern may be formed using a second region of the second layer.

When the circuit component is a capacitor, it may have an electrode formed using the second region of the second layer. When the circuit component is a resistor pattern, a resistor contact plug may be connected to the top surface of the second region, and the resistor contact plug may have a top surface that is substantially coplanar with a top surface of the jumper pattern. The jumper pattern may include a barrier layer in contact with the first region of the second layer. The first layer may include a stopper layer (e.g., the first layer may include a layer of silicon nitride above a layer of silicon oxide).

Details of these and other embodiments are included in the detailed description and drawings.

BRIEF DESCRIPTION OF THE DRAWINGS

The foregoing and other features and advantages of the inventive embodiments will be apparent from the more particular descriptions of preferred embodiments as illustrated in the accompanying drawings in which like reference characters refer to the same parts throughout the different views. The drawings are not necessarily to scale, emphasis instead being placed upon illustrating the principles of the inventive concepts. In the drawings:

FIG. 2A is a schematic layout illustrating a jumper pattern over a transistor structure, a resistor, and a fuse structure in a semiconductor device according to an embodiment of the inventions, and FIG. 2B shows longitudinal cross-sectional views taken along lines I-I', II-II', and III-III' of FIG. 2A;

FIG. 3A is a schematic layout illustrating jumper pattern over a transistor, a resistor, a fuse, and a capacitor structure in a semiconductor device according to an embodiment of the inventions.

FIG. 4 shows longitudinal cross-sectional views schematically illustrating a semiconductor device according to another embodiment of the inventions for a jumper pattern over a transistor, a resistor, a fuse, and a capacitor structure taken along lines IT, II-II', III-III', and IV-IV' of FIG. 3A;

FIGS. 6A to 6C are longitudinal cross-sectional views illustrating steps in a method of fabricating a jumper pattern over a transistor structure, a resistor, and a fuse structure in a semiconductor device according to an embodiment of the inventions, taken along lines I-I', II-II', and III-III' of FIG. 2A;

FIGS. 7A to 7E are longitudinal cross-sectional views illustrating steps in a method of fabricating a semiconductor device including a transistor structure and a jumper pattern, a resistor, and a fuse structure according to an embodiment of the inventions, taken along lines I-I', II-II', III-III', and IV-IV' of FIG. 3A;

FIGS. 8A to 8C are longitudinal cross-sectional views illustrating steps in a method of fabricating a semiconductor device including a transistor structure and a jumper pattern, a resistor, and a fuse structure according to another embodiment of the inventions, taken along lines I-I', II-II', III-III', and IV-IV' of FIG. 3A;

DETAILED DESCRIPTION OF THE EMBODIMENTS

Figure 1A:
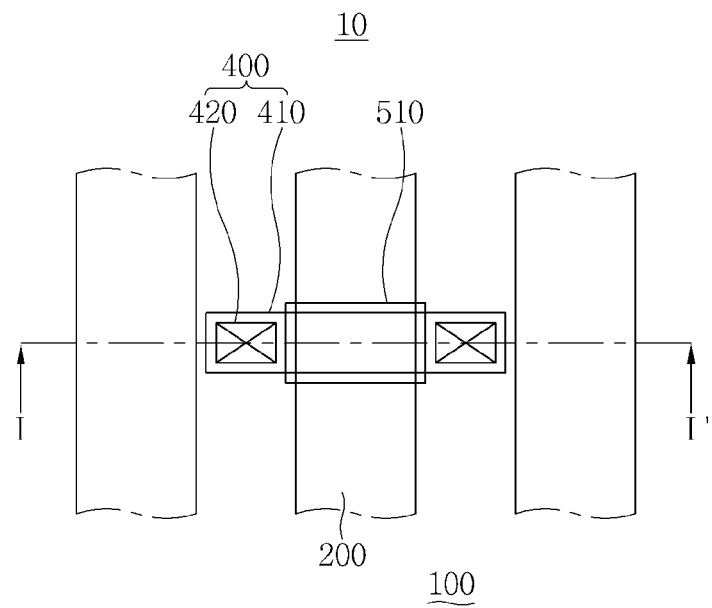
FIG. 1A is a schematic layout illustrating a transistor structure and a jumper pattern in a semiconductor device according to an embodiment of the inventions.

Various embodiments will now be described more fully with reference to the accompanying drawings in which some embodiments are shown. Aspects of the inventions may, however, be embodied in different forms and should not be construed as limited to the embodiments set forth herein. Although a few embodiments of the inventive concept have been shown and described, those of ordinary skill in the art will appreciate that changes may be made in these exemplary embodiments without departing from the principles and spirit of the inventions, the scope of which is defined in the claims and their equivalents.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof (this similarly applies to "includes" and/or "including", "has" or "have" and/or "having", or any other such customarily "open-ended" term).

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly. Also these spatially relative terms such as "above" and "below" as used herein have their ordinary broad meanings— for example element A can be above element B even if when looking down on the two elements there is no overlap between them (just as something in the sky is generally above something on the ground, even if it is not directly above). Also these spatially relative terms such as "above" and "below" as used herein have their ordinary broad meanings—for example element A can be above element B even if when looking down on the two elements there is no overlap between them (just as something in the sky is generally above something on the ground, even if it is not directly above).

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Figure 1B:
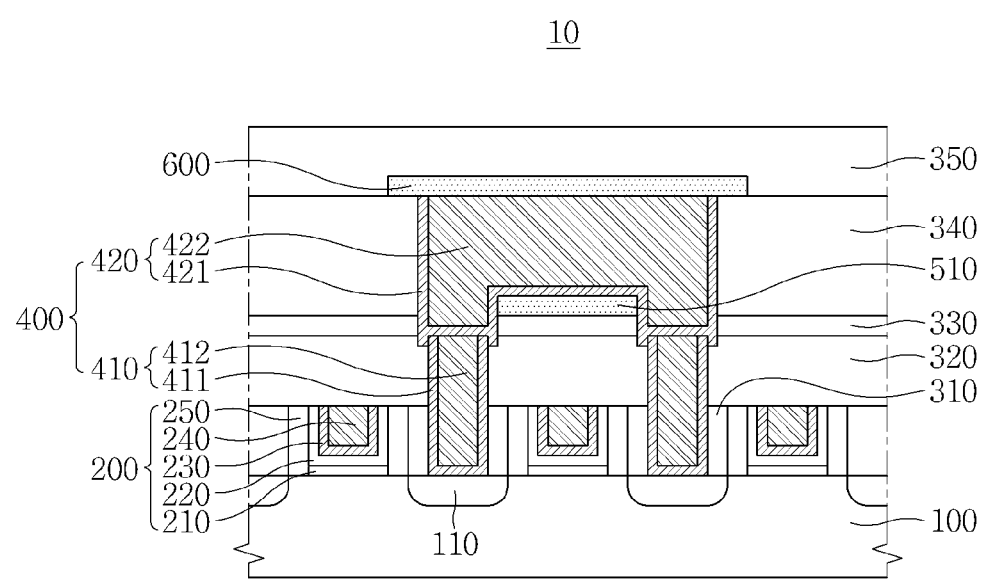
FIG. 1B is a longitudinal cross-sectional view taken along line I-I' of FIG. 1A.

Referring to FIGS. 1A and 1B, a transistor structure 10 of the semiconductor device according to an embodiment of the inventive concept may include gate structures 200 along with a jumper pattern 400 and a blocking pattern 510 on a substrate 100. The transistor structure 10 may include a lower interlayer insulating layer 310 on outer walls of the gate structures 200, and an intermediate interlayer insulating layer 320, a stopper layer 330, an upper interlayer insulating layer 340, and/or an uppermost interlayer insulating layer 350 stacked on the gate structures 200. The transistor structure 10 may also include a metal interconnection layer 600 above the jumper pattern 400 and blocking pattern 510.

The substrate 100 may include a bulk single crystalline silicon wafer, a silicon on insulator (SOI) wafer, or a compound semiconductor wafer containing group III materials and/or group V materials, such as carbon (C), germanium (Ge), tin (Sn), aluminum (Al), gallium (Ga), indium (In), arsenic (As), or antimony (Sb). The substrate 100 may include source/drain regions 110. The source/drain regions 110 may include N type or P type impurities doped in the substrate 100. The N type impurities may include phosphorous (P) or arsenic (As), and the P type impurities may include boron (B). The source/drain regions 110 may include a metal silicide. For example, the metal silicide may include tungsten silicide (WSi), titanium silicide (TiSi), cobalt silicide (CoSi), or nickel silicide (NiSi).

The gate structure 200 may include a buffer insulating layer 210, a gate insulating layer 220, a gate barrier layer 230, a gate electrode layer 240, and a gate spacer 250. The buffer insulating layer 210 may be directly formed directly on the substrate 100. The buffer insulating layer 210 may include oxidized silicon formed by oxidizing a surface of the substrate 100. Alternatively, the buffer insulating layer 210 may include silicon oxide formed through an atomic layered deposition (ALD) process. The gate insulating layer 220 may be directly formed on the buffer insulating layer 210. The gate insulating layer 220 may have a U-shaped longitudinal cross-section to surround a bottom and sides of the gate barrier layer 230. The gate insulating layer 220 may include a metal oxide such as hafnium oxide (HfO) or aluminum oxide (AlO). The gate barrier layer 230 may be formed on an inner surface of the gate insulating layer 220. The gate barrier layer 230 may have a U-shaped longitudinal cross-section to surround a bottom and sides of the gate electrode layer 240. The gate barrier layer 230 may include titanium (Ti), titanium nitride (TiN), tantalum (Ta), tantalum nitride (TaN), titanium nitride (TiW), or another barrier metal. The gate electrode layer 240 may include Ti, TiN, an aluminum (Al) compound, a tungsten (W) compound, or another metal. The gate spacer 250 may be formed on outer sides of the gate insulating layer 220. The gate spacer 250 may be formed in multiple layers. For example, the gate spacer 250 may include an inner silicon oxide and an outer silicon nitride. For simple illustration of the drawings, the gate spacer 250 is illustrated to include a single layer. An upper surface of the gate structure 200 may be planarized. For example, upper surfaces of the gate insulating layer 220, the gate barrier layer 230, the gate electrode layer 240, and the gate spacer 250 may be coplanar with each other.

The lower interlayer insulating layer 310 may surround the outer walls of the gate structures 200. For example, the lower interlayer insulating layer 310 may be in direct contact with outer sides of the gate spacer 250. The lower interlayer insulating layer 310 may include or be formed completely from silicon oxide. The intermediate interlayer insulating layer 320 may be formed on the lower interlayer insulating layer 310 and the gate structures 200 to cover the lower interlayer insulating layer 310 and the gate structures 200. The intermediate interlayer insulating layer 320 may include silicon oxide. For example, when the intermediate interlayer insulating layer 320 may include the same material as the lower interlayer insulating layer 310, a boundary surface between the intermediate interlayer insulating layer 320 and the lower interlayer insulating layer 310 may be indiscernible when viewing a physical embodiment (the planarization of the top surfaces of gate structures 200 will provide an inference that there are two layers). The stopper layer 330 may be formed on the intermediate interlayer insulating layer 320. The stopper layer 330 may include silicon nitride.

The jumper pattern 400 may include at least two jumper contact plugs 410 and a jumper section 420. The jumper contact plugs 410 vertically penetrate the intermediate interlayer insulating layer 320 and the lower interlayer insulating layer 310 to be in contact with the substrate 100 exposed at both sides of the gate structures 200, for example, the source/drain regions 110. Each of the jumper contact plugs 410 may include a contact barrier layer 411 and a contact core layer 412. The contact barrier layer 411 may have a U-shaped longitudinal cross-section to surround a bottom and sides of the contact core layer 412. The contact barrier layer 411 may include Ti, TiN, Ta, TaN, TiW, or another barrier metal. The contact core layer 412 may include Ti, TiN, an Al compound, a W compound, W, copper (Cu), or another metal. The jumper section 420 may vertically penetrate the upper interlayer insulating layer 340 (their top surfaces may be coplanar from a planarization process such as CMP). The upper interlayer insulating layer 340 may surround the sides of the jumper section 420. The jumper section 420 may electrically connect the two jumper contact plugs 410. The jumper section 420 may include a jumper barrier layer 421 and a jumper core layer 422. The jumper barrier layer 421 may include Ti, TiN, Ta, TaN, TiW, or another barrier metal. The jumper core layer 422 may include Ti, TiN, an Al compound, a W compound, W, Cu, or another metal. One end portion of the jumper section 420 may be in direct contact with one of the jumper contact plugs 410, and the other end portion of the jumper section 420 may be in direct contact with the other of the jumper contact plugs 410. The jumper barrier layer 411 of the jumper section 410 may be in direct contact with the blocking pattern 510. A lowermost surface of the jumper barrier layer 421 in contact with the jumper contact plugs 410 may have a width larger than a horizontal width of the jumper contact plugs 410. The jumper barrier layer 421 may extend onto sides of upper portions of the jumper contact plugs 410. For example, the jumper barrier layer 421 may be in contact with outer sides of upper ends of the contact barrier layers 411.

The blocking pattern 510 may be formed between the stopper layer 330 and the jumper section 420 to vertically overlap at least one of the gate structures 200. An upper surface of the blocking pattern 510 may be in contact with the jumper section 420. For example, the blocking pattern 510 may be in direct contact with the jumper barrier layer 421. Sides of the blocking pattern 510 may be in contact with the jumper section 420 and/or the jumper contact plugs 410. For example, the blocking pattern 510 may be in direct contact with the jumper barrier layer 421 or the contact barrier layer 411. The blocking pattern 510 may typically have a horizontal width larger than those of the gate electrode layer 240 and the gate barrier layer 230 of the gate structure 200, which is disposed below the blocking pattern 510 and vertically overlaps the blocking pattern 510. The blocking pattern 510 may include a conductive material. For example, the blocking pattern 510 may include a metal compound such as WSi, TiN, TaN, TiSiN, or TaSiN, etc. having a resistance higher than that of the gate electrode layer 240.

A metal interconnection layer 600 may be formed on the upper interlayer insulating layer 340 and the jumper pattern 400. The metal interconnection layer 600 may be electrically connected to the jumper pattern 400. The metal interconnection layer 600 may include Ti, TiN, an Al compound, a W compound, W, Cu, or another metal.

The uppermost insulating layer 350 may be formed on the upper interlayer insulating layer 340 to cover the metal interconnection layer 600. The uppermost insulating layer 350 may include silicon oxide, silicon nitride, or polyimide.

Since the transistor area 10 of the semiconductor device according to the embodiment includes the blocking pattern 510 having good etch selectivity to the upper interlayer insulating layer 340, the intermediate interlayer insulating layer 320, the lower interlayer insulating layer 310, and the stopper layer 330, the jumper section 420 of the jumper pattern 400 may be prevented from being convex toward the gate structure 200 to be lower than the stopper layer 330. Therefore, short-circuit between the jumper pattern 400 and the gate electrode layer 240 may be prevented, and parasitic capacitance between the jumper section 420 and the gate electrode layer 240 may be reduced to a negligible amount. Because blocking pattern 510 allows the intermediate interlayer insulating layer 320 and the stopper layer 330 to be designed to be thin, the total thickness of the semiconductor device may be reduced. Further, material consumption may be reduced due to reduction in volume, and the fabrication process may be simplified. Furthermore, since the jumper pattern 400 can be highly conductive even with reduced thickness, the efficiency of the jumper pattern 400 may be increased.

Referring to FIGS. 2A and 2B, a semiconductor device according to an embodiment of the inventions may include a transistor structure 10 in a transistor area TA, a resistor structure 20 in a resistor area RA, and a fuse structure 30 in a fuse area FA. The transistor structure 10 and associated jumper pattern 400 and gate structures 200 above substrate 100 may be understood with reference to FIGS. 1A and 1B.

The resistor structure 20 may include a resistor pattern 520 and resistor contact plugs 525. The resistor pattern 520 may be formed on the stopper layer 330 to be located at the same level as blocking pattern 510. The resistor pattern 520 may include the same material as the blocking pattern 510. An upper interlayer insulating layer 340 may be formed over the stopper layer 330 and the resistor pattern 520. At least two resistor contact plugs 525 may vertically penetrate the upper interlayer insulating layer 340 to be in contact with portions of an upper surface of the resistor pattern 520. The resistor contact plugs 525 may have upper surfaces coplanar with the jumper section 420. Each of the resistor contact plugs 525 may include a resistor contact barrier layer 526 and a resistor contact core layer 527. The resistor contact barrier layer 526 may include Ti, TiN, Ta, TaN, TiW, or another barrier metal. The resistor contact core layer 527 may include Ti, TiN, an Al compound, a W compound, W, Cu, or another metal. One of the resistor contact plugs 525 may be in contact with one end portion of the resistor pattern 520, and the other of the resistor contact plugs 525 may be in contact with the other end portion of the resistor pattern 520.

The fuse structure 30 may include a fuse pattern 530 and fuse contact plugs 535. The fuse pattern 530 may be formed on the stopper layer 330 to be located at the same level as the blocking pattern 510 and/or the resistor pattern 520. The fuse pattern 530 may include the same material as the blocking pattern 510 and/or the resistor pattern 520. An upper interlayer insulating layer 340 may be formed on the stopper layer 330 and the fuse pattern 530. At least two fuse contact plugs 535 may vertically penetrate the upper interlayer insulating layer 340 to be in contact with portions of an upper surface of the fuse pattern 530. Each of the fuse contact plugs 535 may include a fuse contact barrier layer 536 and a fuse contact core layer 537. The fuse contact barrier layer 536 may include Ti, TiN, Ta, TaN, TiW, or another barrier metal. The fuse contact core layer 537 may include Ti, TiN, an Al compound, a W compound, W, Cu, or another metal. One of the fuse contact plugs 535 may be in contact with one end portion of the fuse pattern 530, and the other of the fuse contact plugs 535 may be in contact with the other end portion of the fuse pattern 530.

A metal interconnection layer 600 may be formed on the resistor contact plugs 525 and/or the fuse contact plugs 535. The metal interconnection layer 600 may be electrically connected to the resistor contact plugs 525 and/or the fuse contact plugs 535. The metal interconnection layer 600 may include Ti, TiN, an Al compound, a W compound, W, Cu, or another metal. An uppermost insulating layer 350 may be formed on the upper interlayer insulating layer 340 to cover the metal interconnection layer 600.

The resistor structure 20 and/or the fuse structure 30 of the semiconductor device according to the embodiment of FIGS. 2A and 2B may be simultaneously formed using the same material in the process of forming the blocking pattern 510 and the jumper pattern 400 in the transistor area 10. Therefore, the number of processes for fabricating the semiconductor device may be reduced, or the number of processes will not increase even when an additional component is added.

Figure 3B:
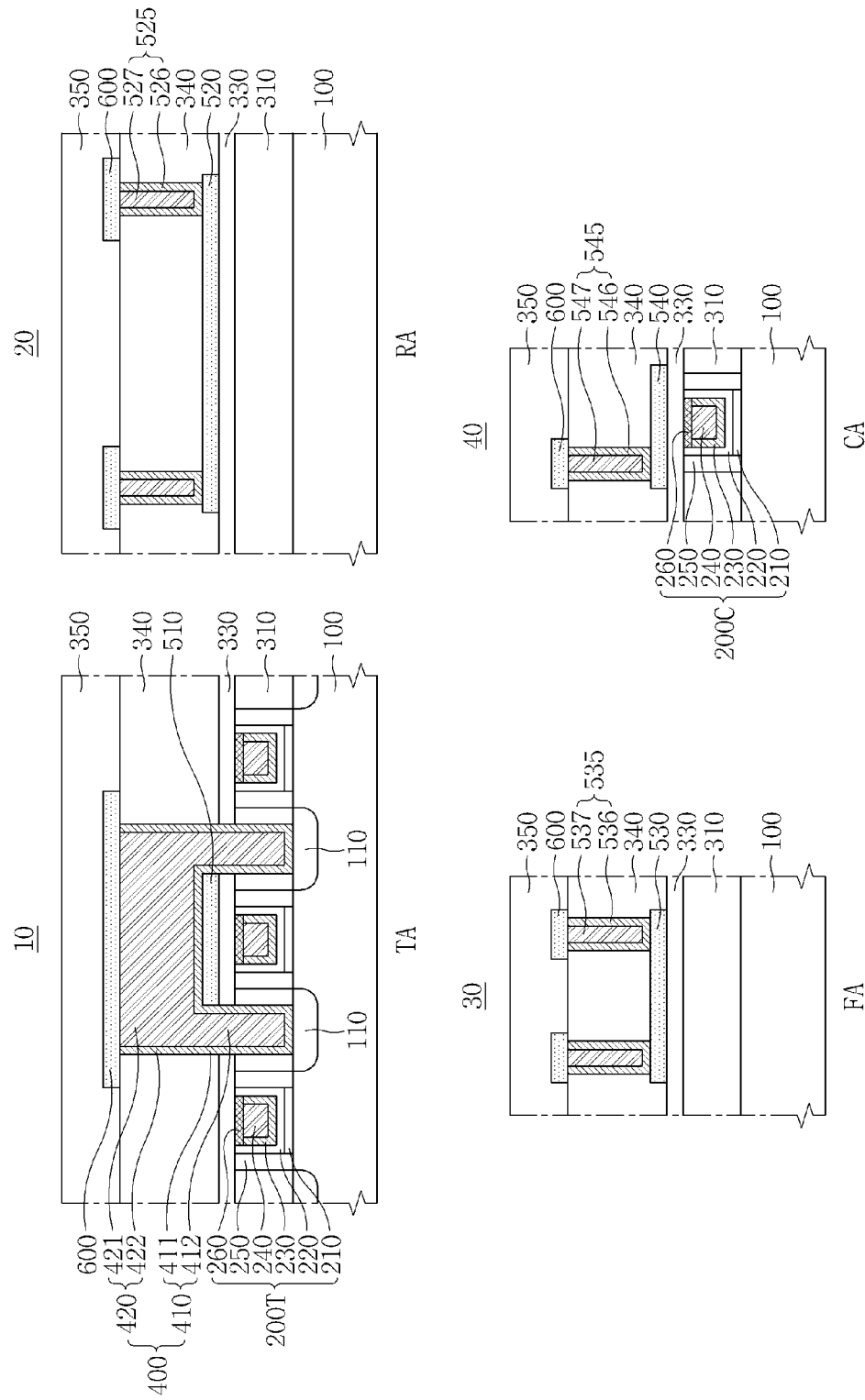
FIG. 3B shows longitudinal cross-sectional views taken along lines I-I', II-II', III-III', and IV-IV' of FIG. 3A.

Referring to FIGS. 3A and 3B, a semiconductor device according to another embodiment of the inventive concept may include a transistor structure 10 in a transistor area TA, a resistor structure 20 in a resistor area RA, a fuse structure 30 in a fuse area FA, and a capacitor structure 40 in a capacitor area CA. In comparison with the embodiment of FIG. 1B, in this embodiment the intermediate interlayer insulating layer 320 of FIG. 1B may be omitted. In FIG. 3B, the stopper layer 330 may be directly formed on lower interlayer insulating layer 310, gate structures 200T for a transistor, and gate structure 200C for a capacitor lower electrode.

Each of the gate structures 200T and 200C may further include a gate capping layer 260. The gate capping layer 260 may be formed between a gate electrode layer 240 and the stopper layer 330. The gate capping layer 260 may be formed on a gate barrier layer 230 to be in contact with inner sidewalls of a gate insulating layer 220 that surrounds barrier layer 230. Alternatively, the gate capping layer 260 may be formed on the gate insulating layer 220 to be in contact with sidewalls of a gate spacer 250. In those two examples, sidewalls of the gate capping layer 260 will be in contact with either the gate insulating layer 220 or the gate spacer 250. The gate capping layer 260 may include silicon nitride, silicon oxide, or metal oxide. Upper surfaces of the gate capping layer 260, the gate insulating layer 220, and/or the gate spacer 250 may be coplanar with each other.

With reference to FIG. 3B, a jumper pattern 400 may include a jumper contact plug part 410 and a jumper section 420. The jumper pattern 400 may include a jumper contact plug barrier layer 411 and a jumper barrier layer 421 in material continuity with each other, and a jumper contact plug core layer 412 and a jumper core layer 422 which also are in material continuity with each other. When compared with FIGS. 1B and 2B in which the barrier layer 421 separates the jumper section 420 from the jumper plugs 410, the jumper contact plugs 410 and the jumper section 420 in FIG. 3B may be formed to be unified and to be in material continuity with each other.

The transistor structure 10 and the associated elements may be further understood with reference further to FIGS. 1A and 1B, and the resistor structure 20 and the fuse structure 30 and associated resistor pattern 520, resistor plugs 525, fuse pattern 530 and fuse plugs 535 may be understood with reference further to FIGS. 2A and 2B.

The capacitor structure 40 embodiment illustrated in FIGS. 3A and 3B includes the gate structure 200C for a capacitor lower electrode and an electrode pattern 540 on the stopper layer 330 for a capacitor upper electrode. The gate structure 200C for a capacitor lower electrode may have the same structure as the gate structure 200T of the transistor area TA (and thus be manufactured at the same time using the same process steps). The gate electrode layer 240 of the gate structure 200C for a capacitor lower electrode may be used as a lower electrode of a capacitor. The gate capping layer 260 and the stopper layer 330 may be used as a dielectric layer of the capacitor. The electrode pattern 540 may be used as an upper electrode of the capacitor. A horizontal width of the electrode pattern 540 may be greater than that of the gate capping layer 260. The capacitor contact plug 545 vertically penetrates the upper interlayer insulating layer 340 to be in contact with the electrode pattern 540. The capacitor contact plug 545 may include a capacitor contact barrier layer 546 and a capacitor contact core layer 547. For example, the capacitor contact plug 545 may use the same materials and be formed in the same process steps as the jumper pattern 400, the resistor contact plug 525, and/or the fuse contact plug 535. A metal interconnection layer 600 may be electrically connected to the capacitor contact plug 545.

The semiconductor device according to the embodiment of FIGS. 3A and 3B may include the gate structure 200C for a capacitor lower electrode having the same structure as the gate structure 200T, and may include the electrode pattern 540 for a capacitor upper electrode using the same materials and process steps as the blocking pattern 510, the resistor pattern 520, and/or the fuse pattern 530. Therefore, since the capacitor structure 40 may be formed using the processes of forming the gate structure 200T, the jumper pattern 400, the blocking pattern 510, the resistor pattern 520, and/or the fuse pattern 530, the fabrication process of the semiconductor device may be simplified.

Referring to FIG. 4, in a semiconductor device according to another alternative embodiment of the inventive concept, the stopper layer 330 illustratively used in FIGS. 1B, 2B and 3B may be omitted. In this embodiment, a blocking pattern 510 may be directly formed on a lower interlayer insulating layer 310 and a gate structure 200T. A resistor pattern 520 and a fuse pattern 530 similarly may be directly formed on the lower interlayer insulating layer 310. An electrode pattern 540 for a capacitor upper electrode may be directly formed on the lower interlayer insulating layer 310 (with gate structure 200C providing a capacitor lower electrode). The gate capping layer 260 of the gate structure 200C may be used as a capacitor dielectric layer.

Figure 5A:
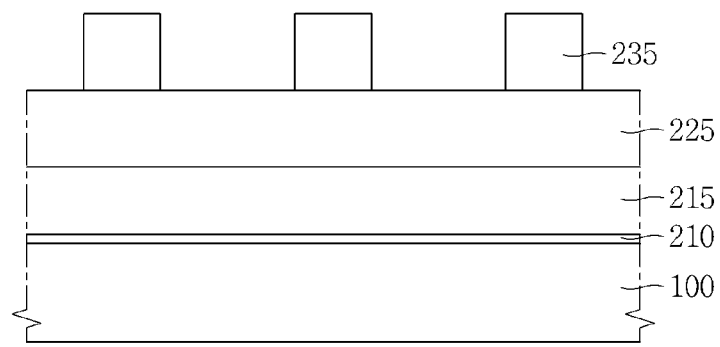
FIGS. 5A to 5R are longitudinal cross-sectional views illustrating methods of fabricating transistor structures and a jumper pattern in a semiconductor device according to embodiments of the inventions, taken along line I-I' of FIG. 1A.

Referring to FIG. 5A, an embodiment of a method of fabricating a semiconductor device according may include forming a buffer insulating layer 210, a sacrificial layer 215, a hard mask layer 225, and a mask pattern 235 on a substrate 100. The substrate 100 may include a bulk silicon wafer or an SOI wafer. The forming the buffer insulating layer 210 may include oxidizing a surface of the substrate 100. Alternatively, forming the buffer insulating layer 210 may include forming a silicon oxide layer on the substrate 100 by performing a deposition process such as an ALD process or a molecular layered deposition (MLD) process. Forming the sacrificial layer 215 may include forming polysilicon by performing a chemical vapor deposition (CVD) process or a low pressure CVD (LPCVD) process, etc. Forming the hard mask layer 225 may include forming silicon nitride by performing a CVD process, etc. Forming the mask pattern 235 may include forming a photoresist pattern by performing a photolithography process.

Figure 5B:
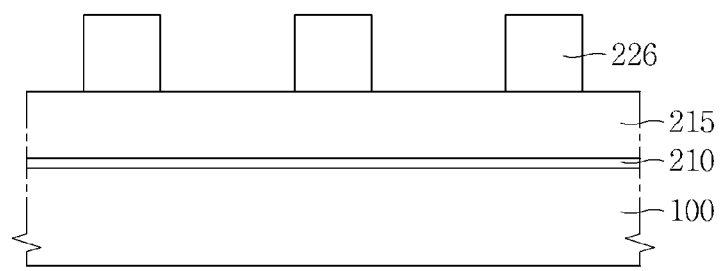

Referring to FIG. 5B, the exemplary method embodiment includes forming a hard mask pattern 226 by etching the hard mask layer 225 using the mask pattern 235 as an etch mask. Then, the mask pattern 235 is removed.

Figure 5C:
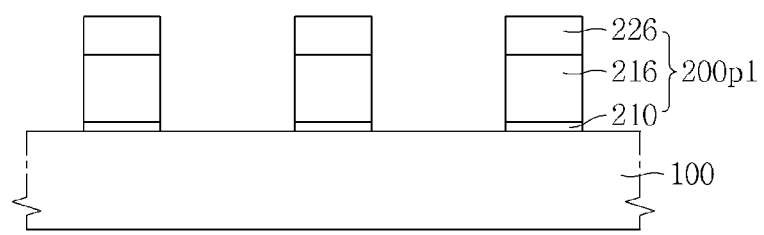

Referring to FIG. 5C, the method then includes forming first preliminary gate structures 200p1 by etching the sacrificial layer 215 and the buffer insulating layer 210 using the hard mask pattern 226 as an etch mask. Each of the first preliminary gate structures 200p1 includes the patterned and stacked buffer insulating layer 210, sacrificial pattern 216, and hard mask pattern 226. In this process, the thickness of the hard mask pattern 226 is reduced.

Figure 5D:
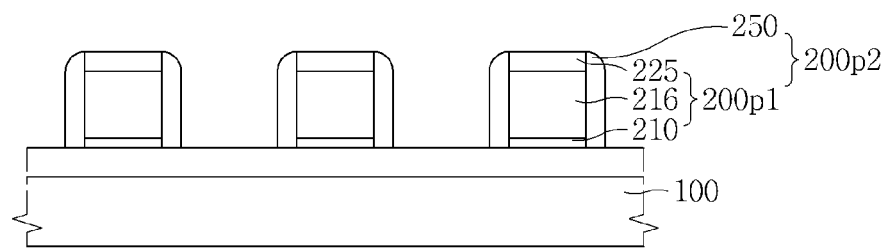

Referring to FIG. 5D, the illustrative method embodiment includes forming a second preliminary gate structure 200p2 by forming gate spacers 250 on sides of the first preliminary gate structures 200p1. The forming the gate spacer 250 may include conformally forming a gate spacer material layer on surfaces of the first preliminary gate structures 200p1 and exposed portions of a surface of the substrate 100, and blanket-etching the gate spacer material layer using an etch back process. The gate spacer 250 may include silicon oxide, silicon nitride, or dual layers thereof. For example, the silicon oxide may be directly formed on the surfaces of the first preliminary gate structures 200p1, and the silicon nitride may be formed on the silicon oxide. To facilitate illustrating the embodiment in FIG. 5D, gate spacer layer 250 is shown as a single layer and may be assumed to be formed using silicon nitride.

Figure 5E:
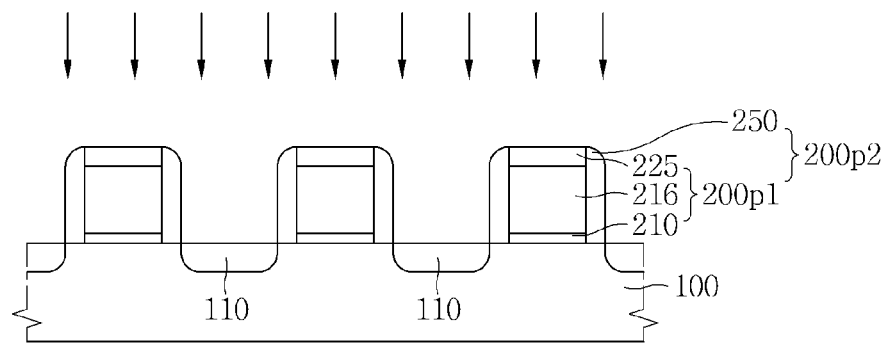

Referring to FIG. 5E, the method includes forming source/drain regions 110 having conductivity by implanting impurity atoms or ions into the substrate 100 exposed at both sides of second preliminary structures 200p2. Examples of such impurity atoms or ions are B, P, and/or As.

Figure 5F:
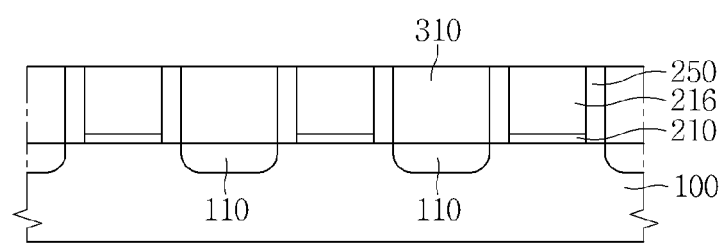

Referring to FIG. 5F, the exemplary method then includes forming a lower interlayer insulating layer 310 covering the second preliminary gate structures 200p2, and removing the hard mask pattern 225 to expose the sacrificial pattern 216 by performing a planarization process such a chemical mechanical polishing (CMP) process. The lower interlayer insulating layer 310 may include silicon oxide, or the like.

Figure 5G:
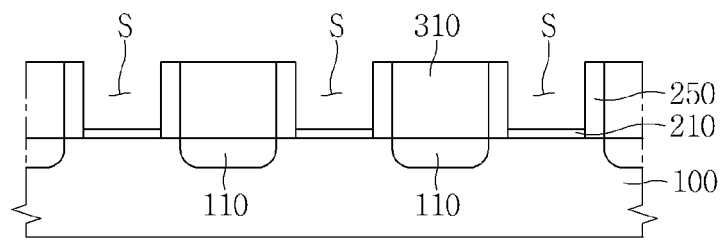

Referring to FIG. 5G, the method includes forming a space S by removing the exposed sacrificial pattern 216. The removing the sacrificial pattern 216 may include, for example, performing a dry etching process using chloride ions (Cl⁻) or chloride radicals (Cl*).

Figure 5H:
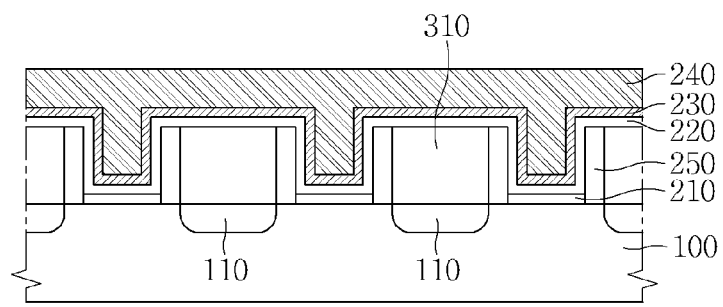

Referring to FIG. 5H, the illustrative method embodiment next includes forming a gate insulating layer 220, a gate barrier layer 230, and a gate electrode layer 240 in the space S. The forming the gate insulating layer 220 may include conformally forming a metal oxide having a higher dielectric constant than silicon oxide, such as HfO, lanthanum oxide (LaO), or AlO, on an upper surface of the buffer insulating layer 210 and inner surfaces of the gate spacers 250 by performing a deposition process such as ALD. The forming the gate barrier layer 230 may include conformally forming Ti, TiN, Ta, TaN, TiW, or another barrier metal on the gate insulating layer 220 by performing a deposition process such as ALD. The forming the gate electrode layer 240 may include forming a metal such as Al, W, Cu, Ni, Co, Ti, Ta, and/or a metal compound such as metal nitride on the gate barrier layer 230 to fill the space S by performing a deposition process such as CVD or PVD (physical vapor deposition), or a plating process.

Figure 5I:
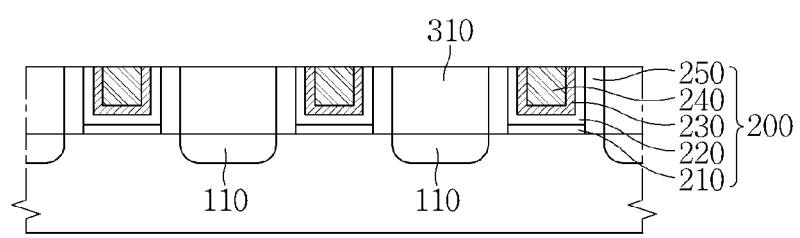

Referring to FIG. 5I, the method then includes forming a gate structure 200 having the buffer insulating layer 210, the gate insulating layer 220, the gate barrier layer 230, the gate electrode layer 240, and the gate spacer 250 by performing a planarization process such as CMP.

Figure 5J:
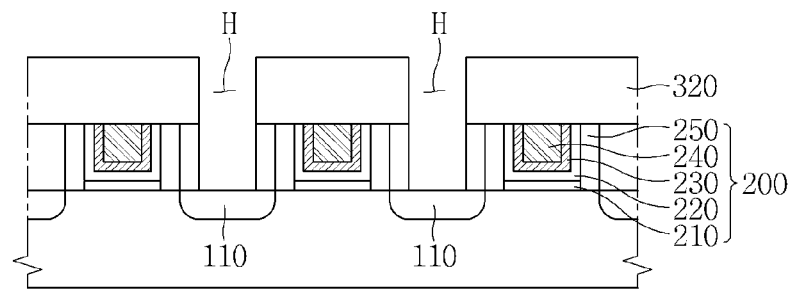

Referring to FIG. 5J, the example method includes forming an intermediate interlayer insulating layer 320 over the gate structures 200 and planarized lower interlayer insulating layer 310, and then forming contact holes H exposing portions of the source/drain regions 110.

Figure 5K:
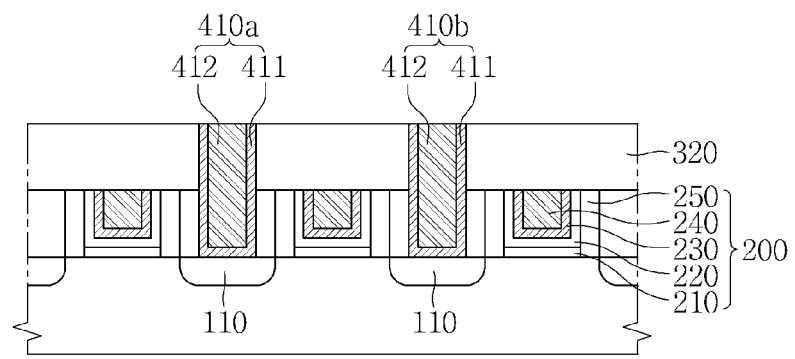

Referring to FIG. 5K, the method includes forming jumper contact plugs (see 410 of FIG. 1B and related description for additional details on these jumper contact plugs) filling the inside of the contact holes H. The forming the jumper contact plugs 410a and 410b includes forming a contact barrier layer 411 on inner walls of the contact holes H and exposed surfaces of the source/drain regions 110, and then forming a contact core layer 412 filling the remainder of the contact holes H. Subsequently, the method may include performing a planarization process such as CMP to be upper surfaces of the jumper contact plugs 410a and 410b and an upper surface of the interlayer insulating layer 320 coplanar.

Figure 5L:
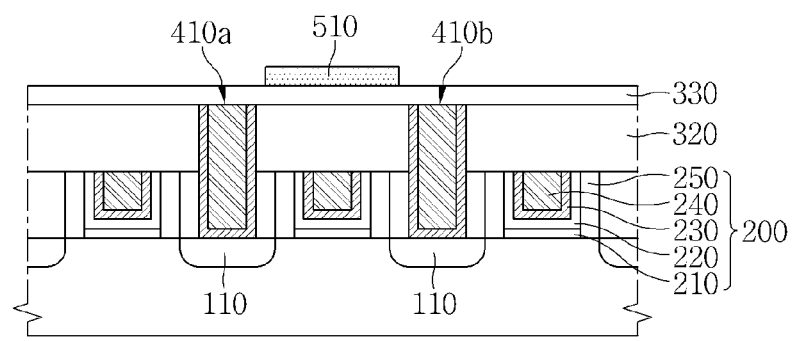

Referring to FIG. 5L, the exemplary method includes forming a stopper layer 330 and a blocking pattern 510 over the intermediate interlayer insulating layer 320 and the jumper contact plugs 410. The stopper layer 330 may, for example, include silicon nitride formed using a CVD process. The blocking pattern 510 may be formed by performing a deposition process followed by a photolithography/etching process. The blocking pattern 510 may include at least one material of various metals, metal alloys, metal compounds, or metal silicides, such as WSi, TiN, TiSiN, or TaN, and TaSiN, or polysilicon.

Figure 5M:
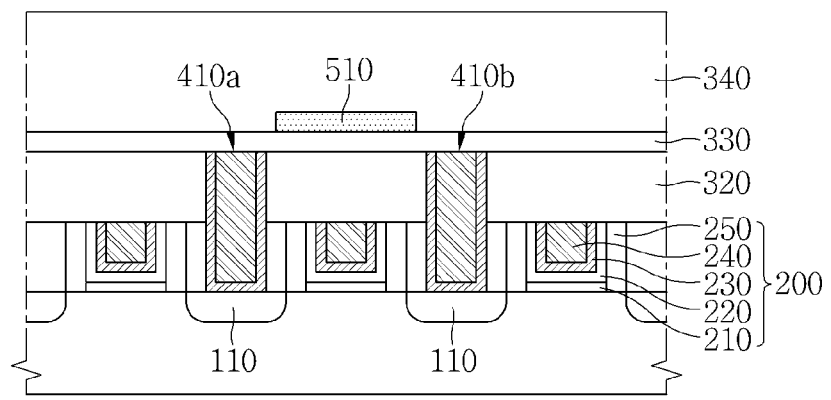

Referring to FIG. 5M, the method includes forming an upper interlayer insulating layer 340 over the stopper layer 330 and the blocking pattern 510. The upper interlayer insulating layer 340 may, for example, include silicon oxide.

Figure 5N:
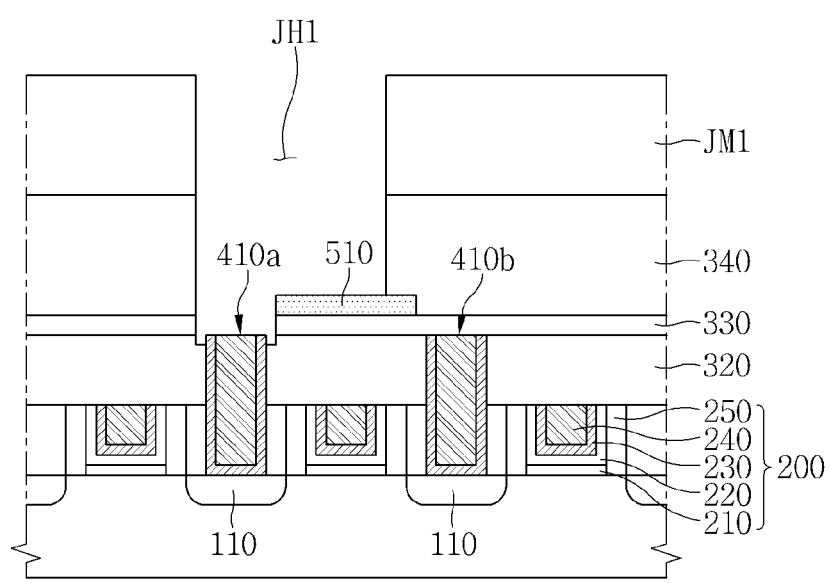

Referring to FIG. 5N, the exemplary method next includes putting down a first jumper mask pattern JM1 and then forming a first jumper hole JH1 to expose a portion of an upper surface of the blocking pattern 510 and an upper surface of the first jumper contact plug 410a, for example by etching the upper interlayer insulating layer 340 and the stopper layer 330 using the first jumper mask pattern JM1 as an etch mask. The intermediate interlayer insulating layer 320 may be over-etched to expose sides of an upper portion of the first jumper contact plug 410a in the first jumper hole JH1. The first jumper mask pattern JM1 may for example be a photoresist. Then, the first jumper mask pattern JM1 may be removed.

Figure 5O:
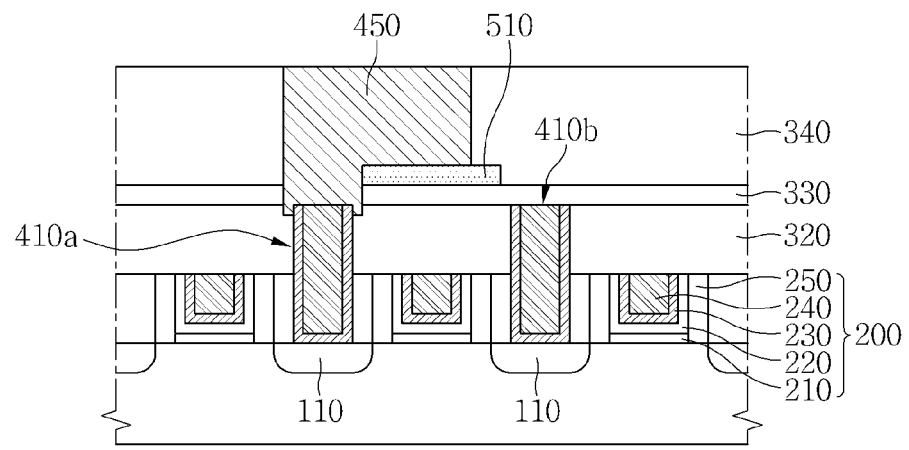

Referring to FIG. 5O, the method then includes depositing a filling material 450 in the first jumper hole (JH1 of FIG. 5N). The filling material 450 may include an organic material such as spin-on-hard mask (SOH). In addition, the process of depositing the filling material 450 may further include etching back the filling material 450 to adjust an upper surface of the filling material 450 and an upper surface of the upper interlayer insulating layer 340 to have a similar surface level.

Figure 5P:
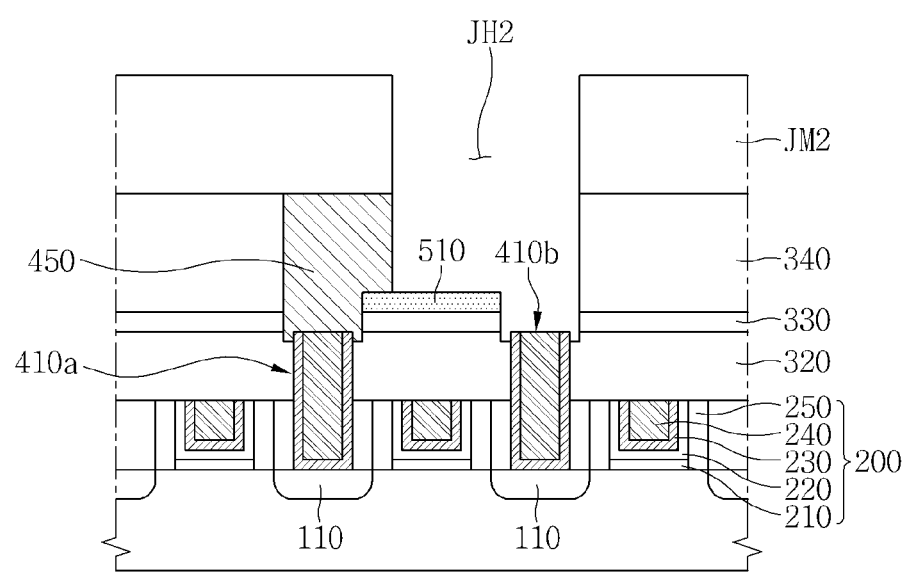

Referring to FIG. 5P, the illustrative method next includes forming a second jumper mask pattern JM2, and forming a second jumper hole JH2 exposing another portion of the upper surface of the blocking pattern 510 and an upper surface of the second jumper contact plug 410b by etching the upper interlayer insulating layer 340 and the stopper layer 330 using the second jumper mask pattern JM2 as an etch mask. The intermediate interlayer insulating layer 320 may be over-etched to expose sides of an upper portion of the second jumper contact plug 410b in the second jumper hole JH2. The second jumper mask pattern JM2 may for example be a photoresist. The first jumper hole JH1 and the second jumper hole JH2 may spatially overlap each other.

Figure 5Q:
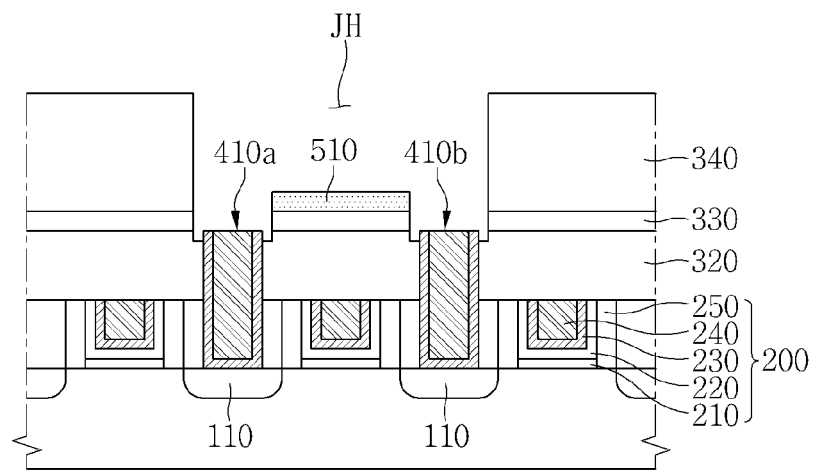

Referring to FIG. 5Q, the method then includes removing the second jumper mask pattern JM2 and the filling material 450. A jumper hole JH including the first jumper hole JH1 and the second jumper hole JH2 may thus be formed. An upper surface and the sides of the upper portion of the first jumper contact plug 410a, an upper surface and the sides of the upper portion of the second jumper contact plug 410b, and the entire upper surface of the blocking pattern 510 in the jumper hole JH is exposed.

Figure 5R:
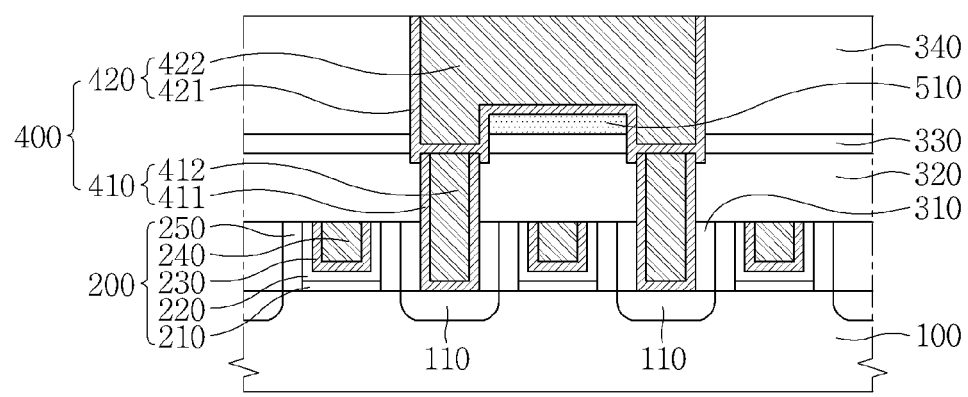

Referring to FIG. 5R, the exemplary method next includes forming a jumper section 420 in the jumper hole JH. The forming the jumper section 420 may include conformally forming a jumper barrier layer 421 on inner walls of the jumper hole JH, forming a jumper core layer 420 filling the jumper hole JH, and then removing the jumper barrier layer 421 and the jumper core layer 422 formed on the upper interlayer insulating layer 340 by performing a planarization process such as CMP. The jumper barrier layer 421 may for example include Ti, TiN, Ta, TaN, or another barrier metal formed through a CVD process. The jumper core layer 422 may for example include a metal such as W, Al or Cu, or a metal alloy formed through a CVD process, a plating process, or the like. The jumper pattern 400 including the jumper contact plugs 410 and the jumper section 420 of the type shown in FIG. 1B may thus be formed by performing the exemplary process of FIGS. 5A-R.

Then, referring to FIG. 1B, the example method illustrated in FIGS. 5A-R may further include forming the metal interconnection layer 600 and the uppermost insulating layer 350 on the upper interlayer insulating layer 340 and the jumper pattern 400. The metal interconnection layer 600 is electrically connected to the jumper pattern 400 and the uppermost insulating layer 350 covers the jumper pattern 400. The uppermost interlayer insulating layer 350 may for example include silicon oxide.

Referring to FIG. 6A, a method of fabricating a semiconductor device according to an embodiment of the inventions includes forming a stopper layer 330 over an intermediate interlayer insulating layer 320 and jumper contact plugs 410a and 410b in a transistor area TA, and forming a blocking pattern 510, a resistor pattern 520, and a fuse pattern 530 on the stopper layer 330 in respective resistor area RA and fuse area FA, by performing the process steps described with reference to FIGS. 5A to 5L. The blocking pattern 510, the resistor pattern 520, and the fuse pattern 530 may be simultaneously formed using the same process steps and therefore include the same material as each another.

Referring to FIG. 6B, the exemplary method includes forming an upper interlayer insulating layer 340, and then forming a jumper hole JH, resistor contact holes RH, and fuse contact holes FH, which penetrate the upper interlayer insulating layer 340 to expose upper surfaces of the blocking pattern 510, the resistor pattern 520, and the fuse pattern 530. The processes described with reference to FIGS. 5N to 5Q may be used to form the holes in FIG. 6B starting with the structures of FIG. 6A. The resistor contact holes RH and the fuse contact holes FH may be formed in either the process of forming the first jumper JH1 or the process of forming the second jumper hole JH2, or in both the processes with reference further to FIGS. 5N to 5P.

Referring to FIG. 6C, the method further includes forming a jumper section 420, resistor contact plugs 525, and fuse contact plugs 535 by performing the processes described with reference to FIG. 5R. The forming the jumper section 420, the resistor contact plugs 525, and the fuse contact plugs 535 may include conformally forming a jumper barrier layer 421, resistor contact barrier layers 526, and fuse contact barrier layers 536 on inner walls of the jumper hole JH, the resistor contact holes RH, and the fuse contact holes FH, forming a jumper core layer 422, resistor contact core layers 527, and fuse contact core layers 537 filling the jumper hole JH, the resistor contact holes RH, and the fuse contact holes FH, and removing the jumper barrier layer 421, the jumper core layer 422, the resistor contact barrier layers 526, the resistor contact core layers 527, the fuse contact barrier layers 536, and the fuse contact core layers 537 formed on the upper interlayer insulating layer 340 by performing a planarization process such as CMP. The jumper barrier layer 421, the resistor contact barrier layers 526, and the fuse contact barrier layers 536 may for example include Ti, TiN, Ta, TaN, or another barrier metal formed through a CVD process. The jumper core layer 422, the resistor contact core layers 527, and the fuse contact core layers 537 may for example include a metal such as W, Al, or Cu, or a metal alloy formed through a CVD process or a plating process.

Next, referring to FIG. 2B, the method of FIGS. 6A to 6C may include forming the metal interconnection layer 600 and the uppermost insulating layer 350 on the upper interlayer insulating layer 340, the jumper pattern 400, the resistor plugs 525, and the fuse plugs 535.

Referring now to FIG. 7A, a method of fabricating a semiconductor device according to an embodiment of the inventions may include forming preliminary gate structures 200Tp for transistors in a transistor area TA and a preliminary gate structure 200Cp for a capacitor lower electrode in a capacitor area CA by performing the processes described with reference to FIGS. 5A to 5I, and recessing gate barrier layers 230 and gate electrode layers 240 by further performing an etch back process.

Figure 7B:
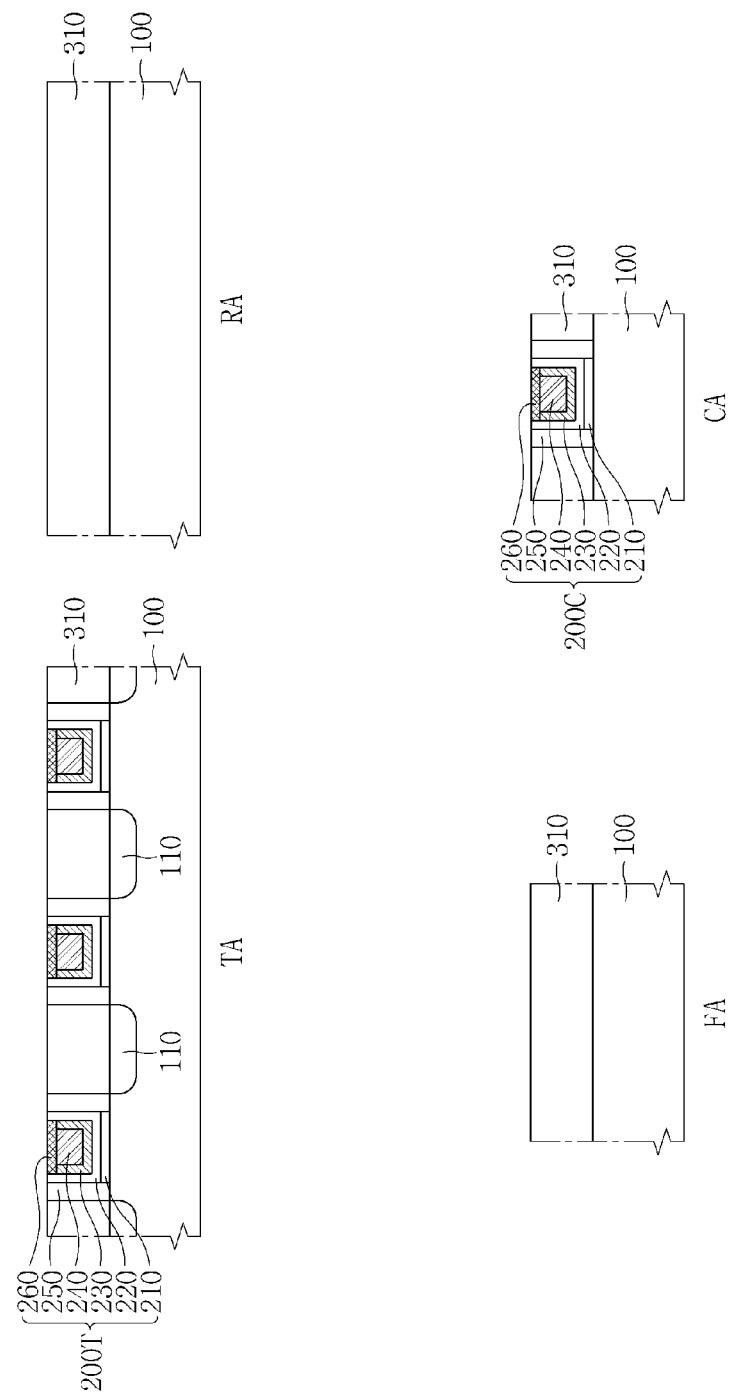

Referring to FIG. 7B, the method includes forming gate structures 200T for transistors and a gate structure 200C for a capacitor lower electrode by forming gate capping layers 260 on the recessed gate barrier layers 230 and gate electrode layers 240. The forming the gate capping layers 260 may include entirely forming a capping material on the recessed gate electrode layers 240 and performing an etch-back process on the capping material.

Figure 7C:
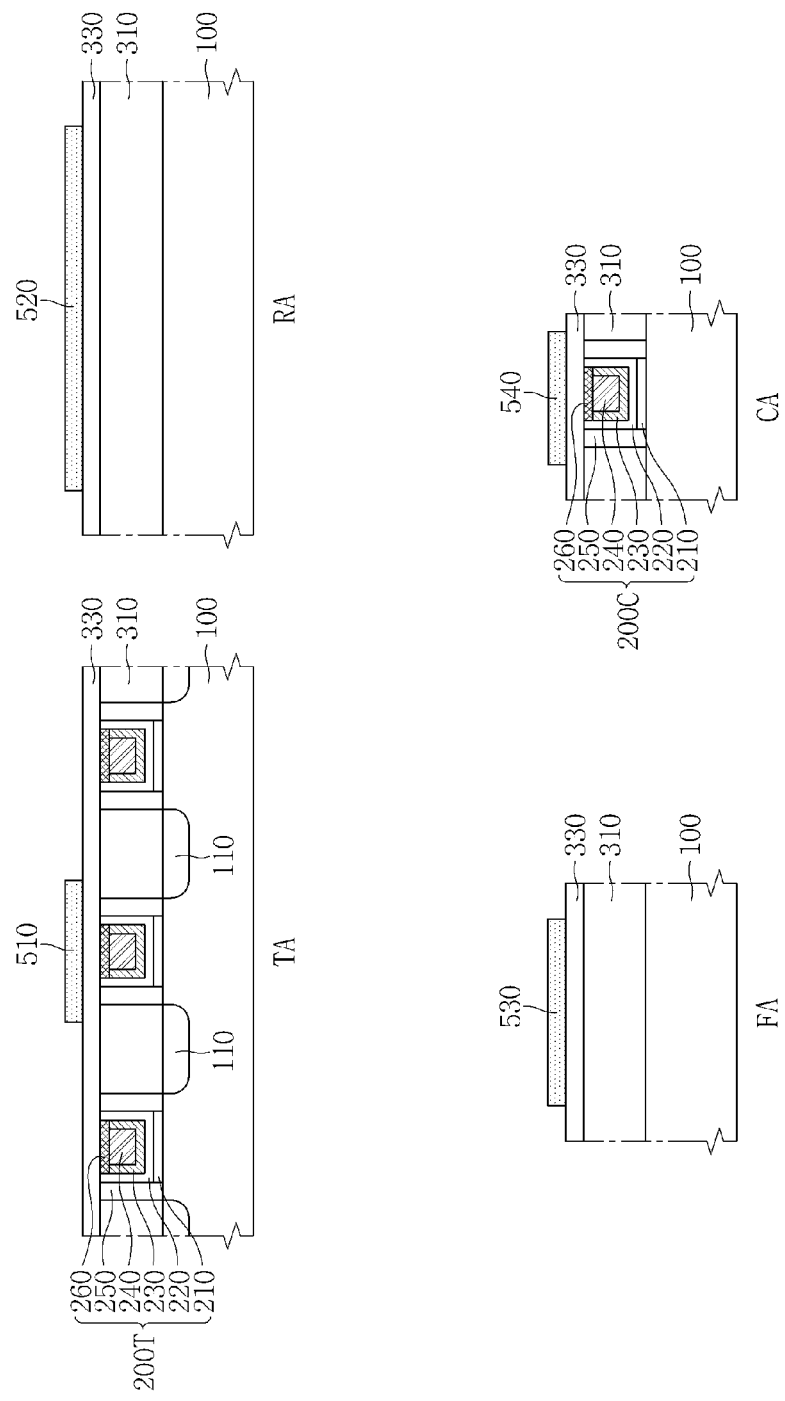

Referring to FIG. 7C, the method next includes forming a stopper layer 330 on the lower interlayer insulating layer 310 and the gate structures 200T and 200C, and forming a blocking pattern 510, a resistor pattern 520, a fuse pattern 530, and an electrode pattern 540 on the stopper layer 330.

Referring to FIG. 7D, the method then includes forming an upper interlayer insulating layer 340, and forming a jumper hole JH, resistor contact holes RH, fuse contact holes FH, and a capacitor contact hole CH, which penetrate the upper interlayer insulating layer 340, and expose the blocking pattern 510, the resistor pattern 520, the fuse pattern 530, and the electrode pattern 540, by performing the processes described with reference to FIGS. 5M to 5Q. The resistor contact holes RH, the fuse contact holes FH, and the capacitor contact hole CH may be formed either in the process of forming the first jumper hole JH1 or the process of forming the second jumper hole JH2.

Referring to FIG. 7E, the method includes forming a jumper pattern 400, resistor contact plugs 525, fuse contact plugs 535, and a capacitor contact plug 545 by performing processes such as those described with reference to FIG. 5R.

Next, referring further to FIG. 3B, the method may further include forming the metal interconnection layer 600 and the uppermost insulating layer 350 on the upper interlayer insulating layer 340, the jumper pattern 400, the resistor contact plugs 525, the fuse contact plugs 535, and the capacitor contact plug 545.

Referring to FIG. 8A, a method of fabricating a semiconductor device according to an embodiment of the inventions includes forming gate capping layers 260 on recessed gate electrode layers 240, and forming a blocking pattern 510, a resistor pattern 520, a fuse pattern 530, and an electrode pattern 540 on a lower interlayer insulating layer 310 and the gate capping layers 260, by performing processes such as those described with reference to FIGS. 5A to 5I and FIGS. 7A and 7B.

Figure 8B:
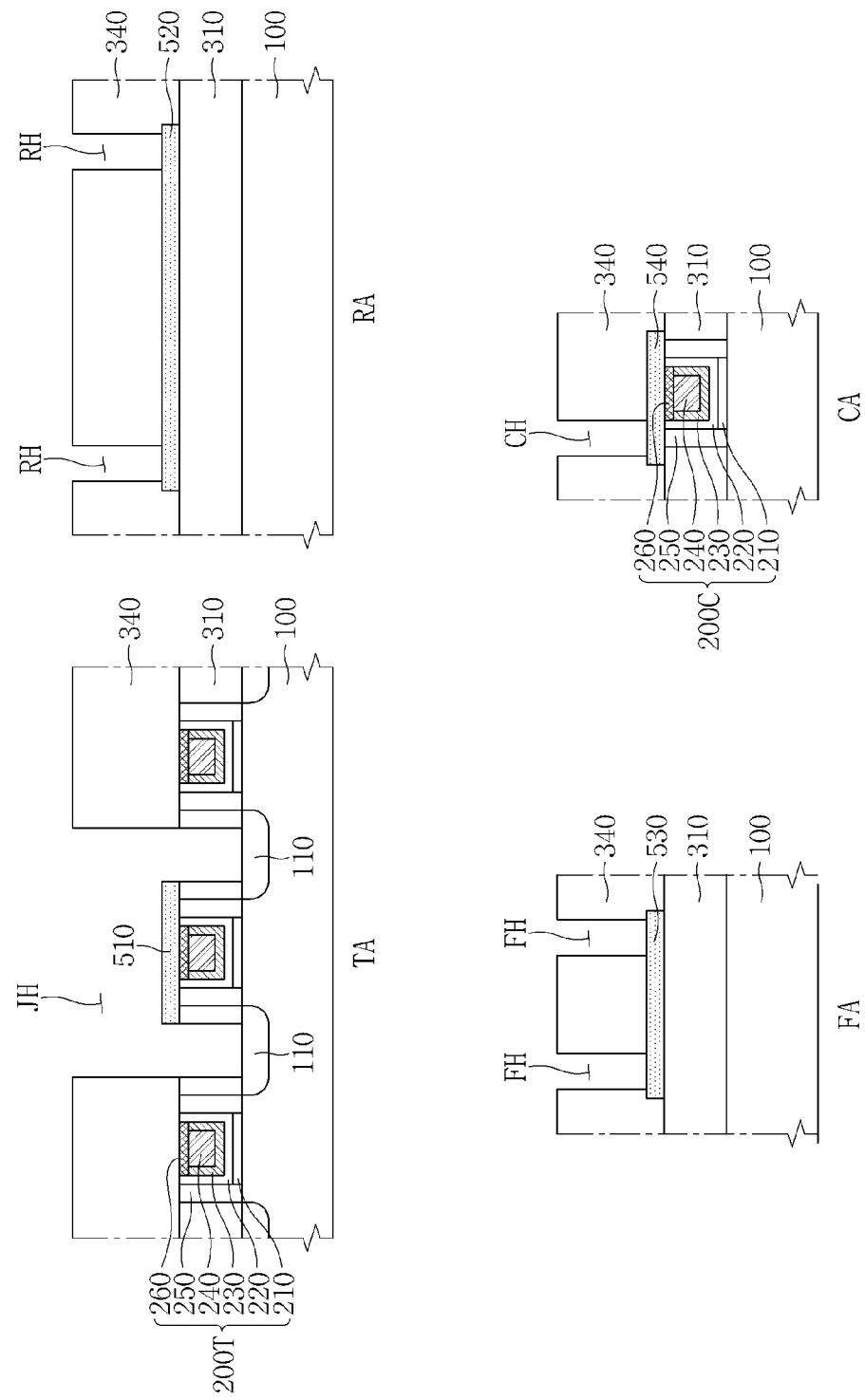

Referring now to FIG. 8B, the method includes forming an upper interlayer insulating layer 340 having a jumper hole JH, resistor contact holes RH, fuse contact holes FH, and a capacitor contact hole CH over (or, in the case of the jumper contact plugs for the jumper hole JH, through) the lower interlayer insulating layer 310, the blocking pattern 510, the resistor pattern 520, the fuse pattern 530, and the electrode pattern 540, by performing processes such as those described with reference to FIGS. 5M to 5Q and 7D.

Figure 8C:
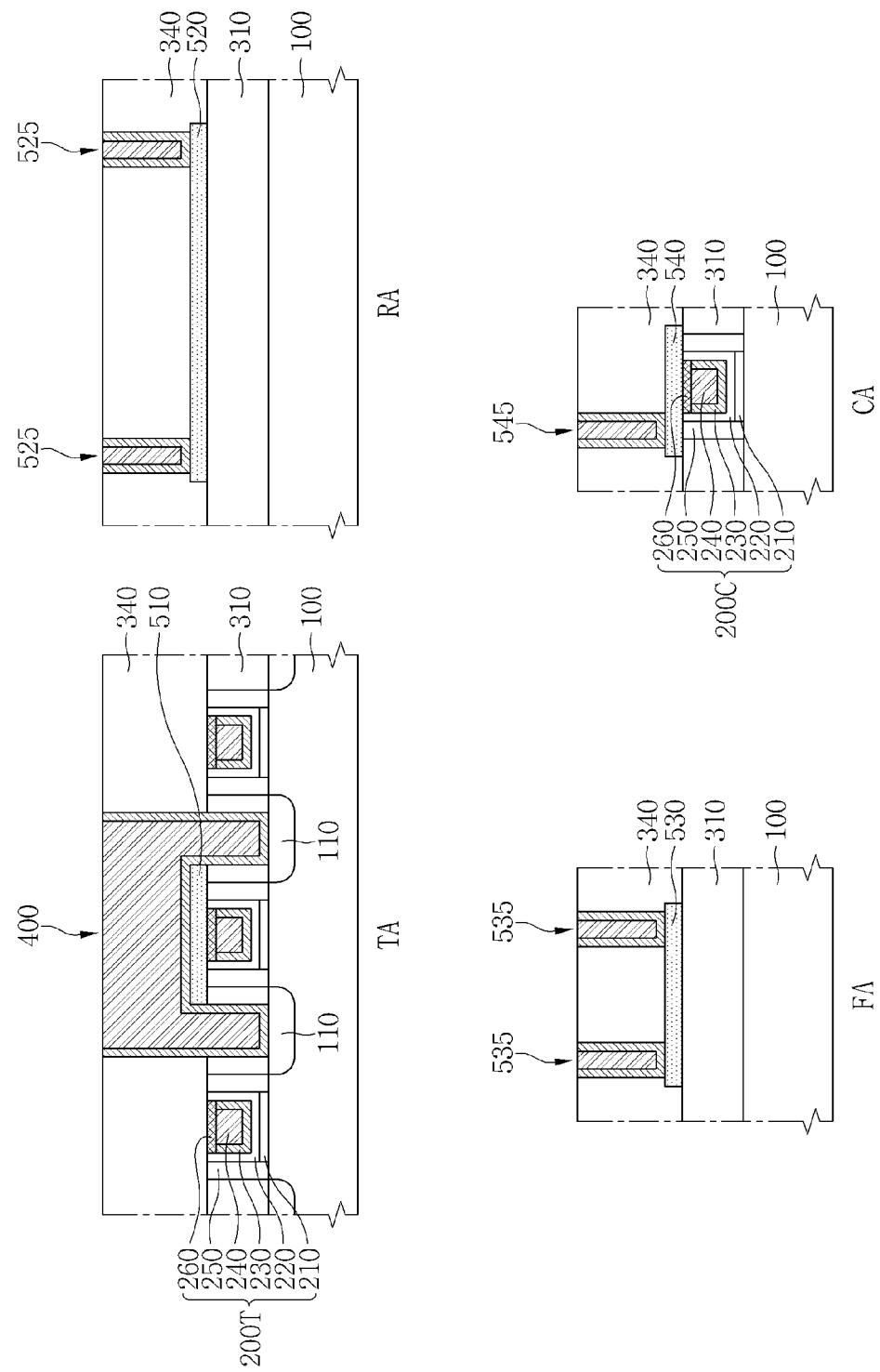

Referring to FIG. 8C, the method includes forming a jumper pattern 400, resistor contact plugs 525, fuse contact plugs 535, and a capacitor contact plug 545 by performing processes such as those described with reference to FIGS. 5R and 7E.

Next, referring further to FIG. 4, the method may further include forming the metal interconnection layer 600 and the uppermost insulating layer 350 over the upper interlayer insulating layer 340, the jumper pattern 400, the resistor contact plugs 525, the fuse contact plugs 535, and the capacitor contact plug 545.

Figure 9A:
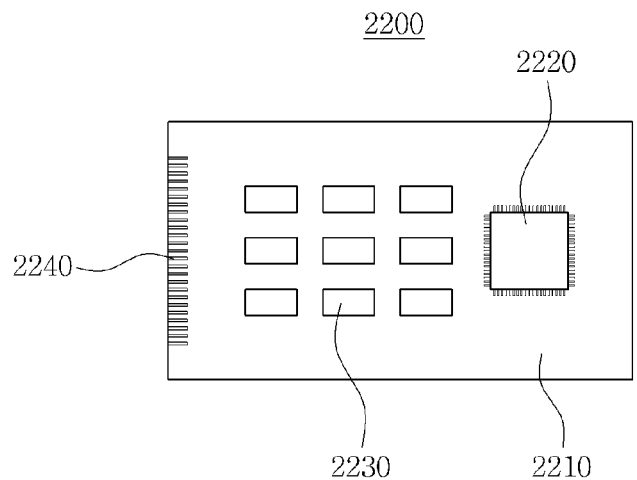
FIG. 9A is a block diagram illustrating a logic card including at least one semiconductor device according to various embodiments of the inventions.

Referring to FIG. 9A, the semiconductor module 2200 according to an embodiment of the inventions may include a processor 2220 and semiconductor devices 2230 mounted on a module substrate 2210. The processor 2220 or the semiconductor devices 2230 include one or more semiconductor devices according to various embodiments of the inventive concept. Input/output terminals 2240 may be arranged along at least one edge of the module substrate 2210.

Figure 9B:
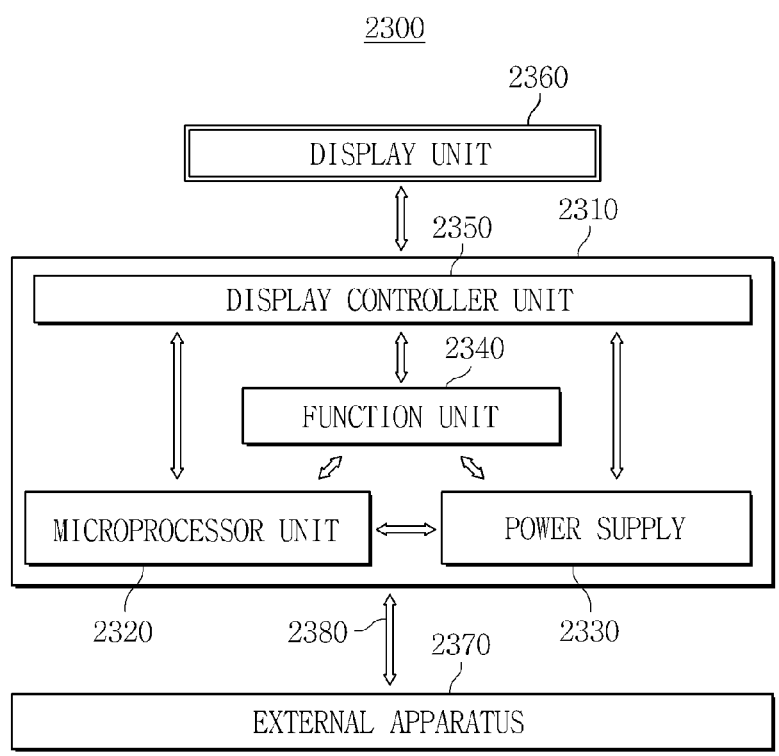
FIGS. 9B and 9C are conceptual block diagrams illustrating electronic systems including at least one semiconductor device according to various embodiments of the inventions.

Referring to FIG. 9B, an electronic system 2300 according to an embodiment of the inventions may include a body 2310, a display unit 2360, and an external apparatus 2370.

The body 2310 may include a microprocessor unit 2320, a power supply 2330, a function unit 2340, and/or a display controller unit 2350. The body 2310 may be a system board or a motherboard including a printed circuit board (PCB), or the like, and/or a case. The microprocessor unit 2320, the power supply 2330, the function unit 2340, and the display controller unit 2350 may be mounted or installed on an upper surface or in the inside of the body 2310. The display unit 2360 may be arranged on the upper surface or in the inside/outside of the body 2310.

The display unit 2360 may display an image processed by the display controller unit 2350. For example, the display unit 2360 may include a liquid crystal display (LCD), an active matrix organic light emitting diode (AMOLED), or various display panels. The display unit 2360 may include a touch screen. Therefore, the display unit 2360 may have an input/output function.

The power supply 2330 may supply a current or voltage to the microprocessor unit 2320, the function unit 2340, the display controller unit 2350, and the like. The power supply 2330 may include a rechargeable battery, a battery socket, or a voltage/current convertor.

The microprocessor unit 2320 may receive a voltage from the power supply 2330 to control the function unit 2340 and the display unit 2360. For example, the microprocessor unit 2320 may include a central processing unit (CPU) or an application processor (AP).

The function unit 2340 may perform various functions of the electronic system 2300. For example, the functional unit 2340 may include a touch pad, a touch screen, a volatile/nonvolatile memory, a memory card controller, a camera, a sound and moving image reproduction processor, a wireless transmission/reception antenna, a speaker, a microphone, a universal serial bus (USB) port, or other units having various functions.

The microprocessor unit 2320 or the function unit 2340 may include at least one semiconductor device according to various embodiments of the inventive concept.

Figure 9C:
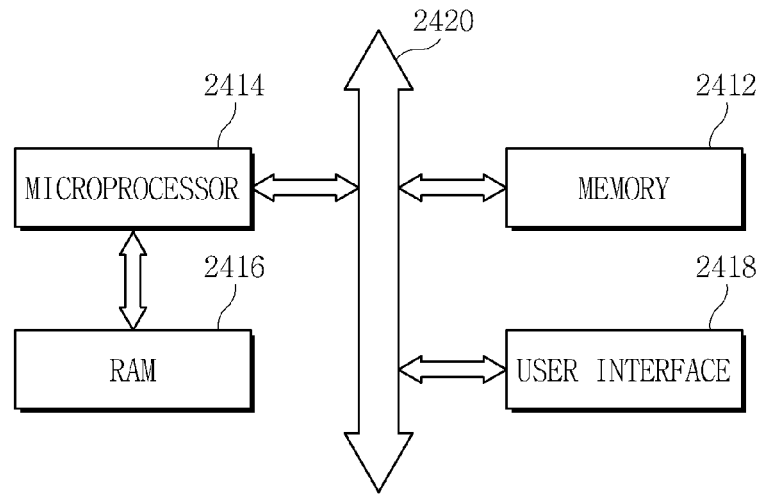

Referring to FIG. 9C, an electronic system 2400 according to an embodiment of the inventions may include a microprocessor 2414, a memory system 2412, and a user interface 2418, which perform data communication through a bus 2420. The microprocessor 2414 may include a CPU or an AP. The electronic system 2400 may further include a random access memory (RAM) 2416 configured to directly communicate with the microprocessor 2414. The microprocessor 2414 and/or the RAM 2416 may be assembled within a single package. The user interface 2418 may be used to input/output information to/from the electronic system 2400. The user interface 2418 may include a touch pad, a touch screen, a keyboard, a mouse, a scanner, a sound director, a cathode ray tube (CRT) monitor, an LCD, an AMOLED, a plasma display panel (PDP), a printer, a written input device or other various input/output devices. The memory system 2412 may store codes for an operation of the microprocessor 2414, data processed by the microprocessor 2414, or external input data. The memory system 2412 may include a memory controller, a hard disc, or a solid state drive (SSD). The microprocessor 2414, the RAM 2416, and/or the memory system 2412 may include at least one of semiconductor devices according to various embodiments of the inventive concept.

Figure 9D:
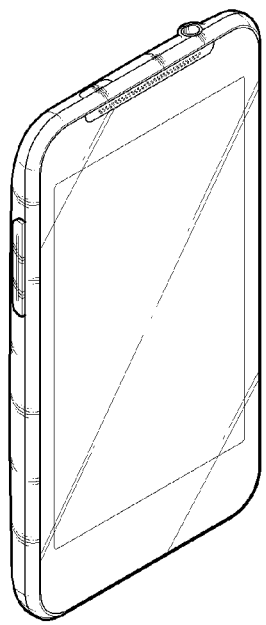
FIG. 9D is a schematic diagram illustrating a mobile wireless apparatus including at least one semiconductor device according to various embodiments of the inventions.

FIG. 9D is a perspective view illustrating a mobile wireless apparatus 2500 including at least one semiconductor device according to various embodiments of the inventions. The mobile wireless apparatus 2500 may be interpreted as a tablet personal computer (PC). In addition, the at least one semiconductor device according to various embodiments of the inventive concept may be used in a portable computer such as a laptop computer, an MPEG-1 Audio Layer 3 (MP3) player, an MP4 player, a navigation apparatus, a SSD, a desktop computer, an automobile, or a home appliance, as well as a tablet PC.

Since a transistor structure of semiconductor devices according to various embodiments of the inventive concept includes a blocking pattern having good etch selectivity to an upper interlayer insulating layer, an intermediate interlayer insulating layer, a lower interlayer insulating layer, and a stopper layer, a jumper section of a jumper pattern may be prevented from being convex toward a gate structure to be lower than the stopper layer. Therefore, short-circuit between the jumper section and a gate electrode layer may be prevented, and parasitic capacitance between the jumper section and the gate electrode layer may be reduced to a negligible amount.

Since the intermediate interlayer insulating layer and the stopper layer may be designed to be thin, the total thickness of the semiconductor device may be reduced. Further, material consumption may be reduced due to reduction in volume and, further advantageously, the fabrication process may be simplified.

Further, because of the conductivity of the jumper pattern, the efficiency of the jumper pattern configured to connect two source/drain regions and/or two lower jumper contact plugs may be increased.

A resistor structure and/or a fuse structure of the semiconductor devices according to various embodiments may be simultaneously formed using the same material and process steps in the process of forming the blocking pattern and the jumper pattern. Therefore, the number of processes for fabricating the semiconductor device may be reduced, or the number of processes may not be increased even when an additional component is added.

The semiconductor devices according to various embodiments may include a gate structure for a capacitor lower electrode having the same structure as transistor gate structures in the device, and may include an electrode pattern for a capacitor upper electrode formed from the same layer as the blocking pattern, the resistor pattern, or the fuse pattern. Therefore, since the capacitor structure may be formed using the processes of forming the gate structure, the jumper pattern, the blocking pattern, the resistor pattern, and/or the fuse pattern, the fabrication process of the semiconductor device may be simplified.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of this inventive concept as defined in the claims.

What is claimed is:

1. A semiconductor device comprising:
    a substrate;
    a gate structure disposed above the substrate;
    a first interlayer insulating layer disposed above the substrate;
    a blocking pattern disposed above the first interlayer insulating layer and the gate structure; and
    a jumper pattern disposed above the blocking pattern, the jumper pattern including jumper contact plugs vertically penetrating the first interlayer insulating layer to be in contact with the substrate at first and second sides of the gate structure, and a jumper section electrically connecting the jumper contact plugs,
    wherein:
    the blocking pattern is disposed horizontally between the jumper contact plugs, and
    side surfaces of the blocking pattern are not vertically aligned with side surfaces of the jumper contact plugs.

2. The semiconductor device of claim 1, wherein the blocking pattern vertically overlaps the gate structure.

3. The semiconductor device of claim 1, wherein the blocking pattern comprises a conductive material.

4. The semiconductor device of claim 1, wherein an upper surface of the blocking pattern is in contact with a bottom surface of the jumper section.

5. The semiconductor device of claim 4, wherein the side surfaces of the jumper contact plugs and the jumper section are in contact with the side surfaces of the blocking pattern.

6. The semiconductor device of claim 1, further comprising:
    a stopper layer including silicon nitride formed above the first interlayer insulating layer;
    a second interlayer insulating layer formed above the first interlayer insulating layer and surrounding at least some of the jumper section; and
    an upper insulating layer formed above the second interlayer insulating layer and the jumper section.

7. The semiconductor device of claim 6, wherein the blocking pattern is in contact with the stopper layer.

8. The semiconductor device of claim 1, further comprising a resistor pattern formed above the first interlayer insulating layer.

9. The semiconductor device of claim 8, further comprising a resistor contact plug in contact with the resistor pattern, wherein an upper surface of the resistor contact plug and an upper surface of the jumper section are coplanar.

10. The semiconductor device of claim 8, further comprising a fuse formed above the first interlayer insulating layer, wherein a lower surface of the fuse and a lower surface of the blocking pattern are coplanar.

11. The semiconductor device of claim 10, further comprising a fuse contact plug in contact with the fuse, wherein an upper surface of the fuse contact plug and an upper surface of the jumper section are coplanar.

12. The semiconductor device of claim 1, further comprising:
    a capacitor lower electrode formed above the substrate and having substantially the same structure as the transistor gate structure;
    a capping layer disposed on the capacitor lower electrode; and
    a capacitor upper electrode formed above the first interlayer insulating layer, and
    wherein the blocking pattern and the capacitor upper electrode comprise the same material.

13. The semiconductor device of claim 1, wherein each of the jumper contact plugs includes a contact barrier layer and a contact core layer, and the contact barrier layer is in contact with the substrate, and surrounds a bottom and sides of the contact core layer, and the jumper section includes a jumper barrier layer and a jumper core layer, and the jumper barrier layer is in contact with an upper surface of the blocking pattern, and surrounds a bottom and sides of the jumper core layer.

14. The semiconductor device of claim 13, wherein the contact barrier layer and the jumper barrier layer are formed from the same material.

15. A semiconductor device comprising:
    a substrate;
    a gate structure disposed above the substrate;
    a first layer disposed above the substrate, the first layer formed using an insulating material and having a substantially planar top surface;
    a second layer in contact with the top surface of the first layer, the second layer formed using a metal and including discrete first and second regions having substantially coplanar top surfaces;
    a jumper pattern disposed on the top surface of the first region of the second layer, the jumper pattern including jumper contact plugs extending through the first layer to contact the substrate at first and second sides of the gate structure, and a jumper section electrically connecting the jumper contact plugs; and
    a circuit component formed using the second region of the second layer, the circuit component being a resistor, a capacitor or a fuse,
    wherein the jumper section and the jumper contact plugs are formed together as a continuous material.

16. The semiconductor device of claim 15, wherein the circuit component is a capacitor having an electrode formed using the second region of the second layer.

17. The semiconductor device of claim 15, wherein the circuit component is a resistor formed using the second region of the second layer, and further comprising a resistor contact plug connected to the top surface of the second region, the resistor contact plug having a top surface that is substantially coplanar with a top surface of the jumper pattern.

18. The semiconductor device of claim 15, wherein the jumper pattern includes a barrier layer in contact with the first region of the second layer.

19. The semiconductor device of claim 15, wherein the first layer comprises a stopper layer.

20. A semiconductor device comprising:
    a substrate;
    a gate structure disposed above the substrate;
    a first interlayer insulating layer disposed above the substrate;
    a blocking pattern disposed above the first interlayer insulating layer and the gate structure; and
    a jumper pattern disposed above the blocking pattern, the jumper pattern including jumper contact plugs vertically penetrating the first interlayer insulating layer to be in contact with the substrate at first and second sides of the gate structure, and a jumper section electrically connecting the jumper contact plugs, wherein:

an upper surface of the blocking pattern is in contact with a bottom surface of the jumper section, and side surfaces of the jumper contact plugs are in contact with side surfaces of the blocking pattern.

\* \* \* \* \*